United States Patent [19]

Bottomley et al.

[11] Patent Number: 4,812,760
[45] Date of Patent: Mar. 14, 1989

[54] MULTI-DIMENSIONAL SELECTIVE NMR EXCITATION WITH A SINGLE RF PULSE

[75] Inventors: Paul A. Bottomley, Clifton Park; Christopher J. Hardy, Schenectady; Matthew O'Donnell, Schenectady; Peter B. Roemer, Schenectady, all of N.Y.

[73] Assignee: General Electric Company, Schenectady, N.Y.

[21] Appl. No.: 78,427

[22] Filed: Jul. 27, 1987

[51] Int. Cl.[4] ............................................. G01R 33/20
[52] U.S. Cl. ..................................................... 324/309
[58] Field of Search ................ 324/307, 309, 310, 313, 324/314

[56] References Cited

U.S. PATENT DOCUMENTS 4,528,509 7/1985 Radda et al. ........................ 324/309
4,558,277 12/1985 Post et al. ............................ 324/309

Primary Examiner—Stewart J. Levy
Assistant Examiner—Kevin D. O'Shea
Attorney, Agent, or Firm—Geoffrey H. Krauss; James C. Davis, Jr.; Marvin Snyder

[57] ABSTRACT

A single rotating NMR $\pi$ pulse provides simultaneous spatially-selective inversion or spin-echo refocussing of nuclear pins in two orthogonal dimensions. The two-dimensional spatially-selective pulse utilizes a single RF pulse, with either a square of an amplitude-modulated or a frequency-modulated envelope, and applied in the presence of an amplitude-modulated magnetic field gradient which reorients through the desired dimensions in which selection is desired while the RF pulse is present. These rotating, or "$\rho$", pulses are useful for reduction of aliasing signal artifacts is restricted field-of-view high-resolution NMR imaging and, when combined with one-dimensional-localized chemical shift spectroscpoy techniques (such as those employing surface detection coils) is especially useful for the production of three-dimensionally localized NMR spectra. Substantial suppression of undesirable residual excited signals, arising from outside the desired two-dimensional spatially selected region, can be obtained by simulated annealing optimization of both the RF and magnetic field gradient amplitude portions of the $\rho$ pulse and/or by use of surface coil detection. The location of the selected volume is varied by frequency modulation of the RF signal pulse, or by variation of the ratio of currents in the halves of the magnetic field gradient coils.

25 Claims, 12 Drawing Sheets

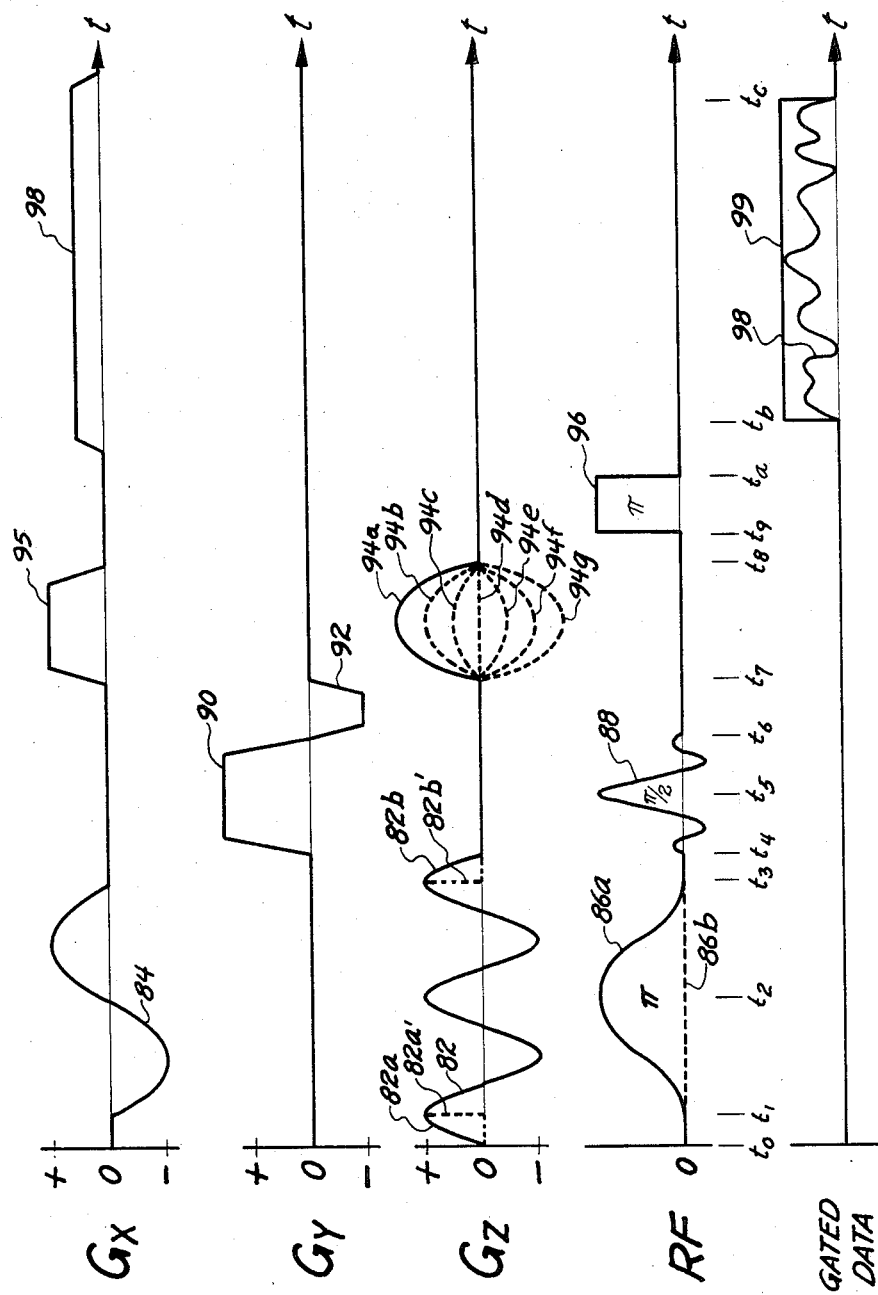

MULTI-DIMENSIONAL SELECTIVE NMR EXCITATION WITH A SINGLE RF PULSE

BACKGROUND OF THE INVENTION

The present invention relates to nuclear magnetic resonance (NMR) imaging and spectroscopy and, more particularly, to a novel class of pulses for refocussing or inversion of spins substantially only in a two-dimensional spatially-selective area, responsive to a single radio-frequency (RF) magnetic field pulse, applied in the presence of an amplitude-modulated magnetic field gradient which reorients itself through the desired two dimensions while that RF pulse is present.

A basic and critical part of a substantial number of NMR imaging and spatially-resolved spectroscopy methods is the selective excitation of nuclear spins in a single spatial dimension. The single dimension selective excitation function is typically carried out by application of a RF magnetic field $H_1$ signal pulse simultaneous with the presence of a linear magnetic field gradient. Spatial localization can provide slice selection with Gaussian, sinc, sech, and the like function profile shapes, dependent upon the amplitude-modulation or frequency-modulation characteristics of the RF signal pulse. It is difficult to provide, in present selective-excitation applications, complete three-dimensional localization of NMR signals in heterogeneous objects; typically, the NMR signal is spatially localized in only one dimension for each selective RF pulse application, thus necessitating the repeated use of RF and magnetic field gradient pulses, which often require multipulse sequences separated by relatively long periods required for longitudinal spin-magnetization recovery. If, for example, a three-dimensional chemical-shift spectroscopy method uses selective inversion and requires eight different sequence applications (e.g. the eight combinations of three pulse orthogonal magnetic field gradients, with each gradient being turned either on or off) and subsequent addition/subtraction of signals to yield a spectrum from a single fully-resolved selected volume element (voxel), as described by Ordidge et al. (66 J. Magn. Reson. 283 (1986)) and known as the "ISIS" method, it will be seen that erroneous ous signal summation can occur, with concomitant compromise of voxel localization, should the sample position change, relative to the gradient fields during the eight-fold sequence application due to physiological motions during in vivo studies and the like. In conventional NMR imaging procedures, it is often desirable to acquire a high-resolution two-dimensional image restricted to a small portion of a much larger sample volume. Attempting to obtain such an image by conventional methods is likely to produce artifacts caused by NMR response signals derived from excited spins lying outside the region of interest which fold back into the resulting image.

Spatial localization thus remains a major problem in many in vivo spectroscopy and imaging techniques. It is therefore highly desirable to provide a selective excitation pulse capable of spatial localization in more than a single dimension.

BRIEF SUMMARY OF THE INVENTION

In accordance with the present invention, a single NMR pulse for providing two-dimensional spatially-selective spin inversion or spin refocusing in a sample, comprises a 180°, or $\pi$, RF signal pulse having an envelope amplitude modulated to one of square, Gaussian, sinc, sech and the like shapes, and applied to the sample during the presence of a pair of spatially-orthogonal time-dependent magnetic field gradients which provide a net applied magnetic field gradient having a direction reorienting through the pair of spatial dimensions in which localization is to occur. By providing different combinations of the RF modulation envelope and the time dependence of the gradient reorientation, different spatial sensitivity profiles of the spin inversion and refocusing function can be provided by this rotating, or $\rho$, RF and gradient pulse combination.

Presently preferred forms of these $\rho$ pulses, providing a magnetic field gradient rotating through two dimensions during the presence of a single RF excitation signal pulse, all utilize a RF pulse having an envelope which is symmetrical about its temporal midpoint, with the orthogonally-oriented magnetic field gradient pair comprising a first direction gradient having an amplitude function which is symmetrical about the temporal midpoint, while the other magnetic field gradient function is anti-symmetrical about the temporal midpoint thereof. "Sombrero", "Egg Carton" and "Stalagmite" pulses all dmonstrate a desirable degree of spatial selectivity; any one of a class of "Monad" pulses, resulting from the computerized modification of the pulses by a simulated annealing process, will substantially excite NMR signals only at the voxel at which inversion or refocussing is desired, while leaving substantially unexcited those NMR response signals from regions substantially removed from the large voxel.

Accordingly, it is an object of the present invention to provide a method for the inversion or refocusing of nuclear spins substantially only at a single preselected voxel of a sample subjected to NMR excitation.

This and other objects of the present invention will become apparent upon a reading of the following detailed description, when considered in conjunction with the drawings.

BRIEF DESCRIPTION OF THE DRAWINGS

FIGS. 7a, 8 and 9 are each a time-coordinated set of Cartesian-coordinate magnetic field gradients, RF and gated NMR response signals for an exemplary NMR imaging/spectroscopy sequence utilizing the excitation ρ pulse signal of the present invention for multi-dimensional spatial selection;

DETAILED DESCRIPTION OF THE INVENTION

Figure 1:
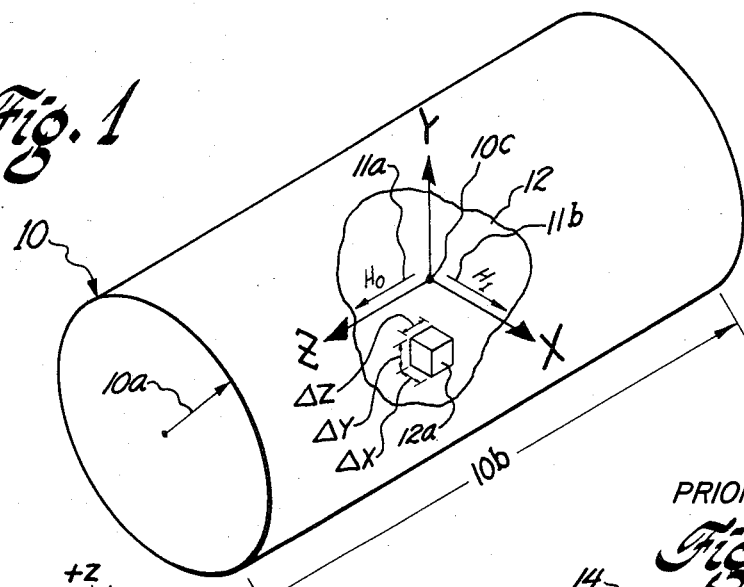
FIG. 1 is a perspective view of the sample observation volume of a nuclear magnetic resonance (NMR) imaging/spectroscopy system, and useful for defining several characteristics thereof.

Referring initially to FIG. 1, the substantially cylindrical bore 10 of a nuclear magnetic resonance (NMR) imaging/spectroscopy system is shown. This open bore, having a radius 10a, which can be on the order of 0.5 meter, and length 10b, which can be on the order of 3 meters, can be formed along the axis of a resistive or superconducting magnet (in manner well known to the art). The center 10c of the volume can be defined, for example, at the origin of a Cartesian coordinate set of volume vectors X, Y and Z. The magnet provides a main static magnetic field 11a, of magnitude $H_O$, in which can be provided (by means not-shown, but well known to the art) gradient magnetic field $G_x$, $G_y$ and $G_z$; a radio-frequency (RF) magnetic field 11b, of magnitude $H_1$, can also be provided within volume 10 by RF coil means also not shown but well known to the art. A sample 12, to be investigated, is placed within volume 10 for imaging and/or spectroscopy investigation thereof. Illustratively, after investigation of the overall volumetric sample 12, a single volumetric element (voxel) 12a is to be more deeply investigated, such that localization of NMR excitation and/or response signals to the relatively small expanse $\Delta x$, $\Delta y$, $\Delta z$ of voxel 12a is desirable.

Figure 2A:
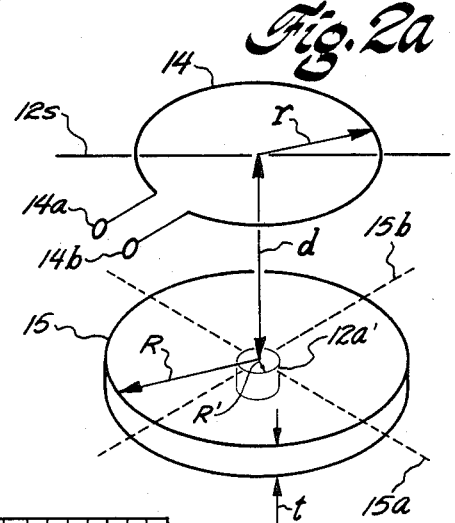
FIGS. 2a and 2b are a perspective view of a prior art surface coil and its sensitive volume, and a graph illustrating the relationship of the sensitive volume radius with respect to depth, and useful in understanding one of the problems alleviated by the present invention.
Figure 2B:
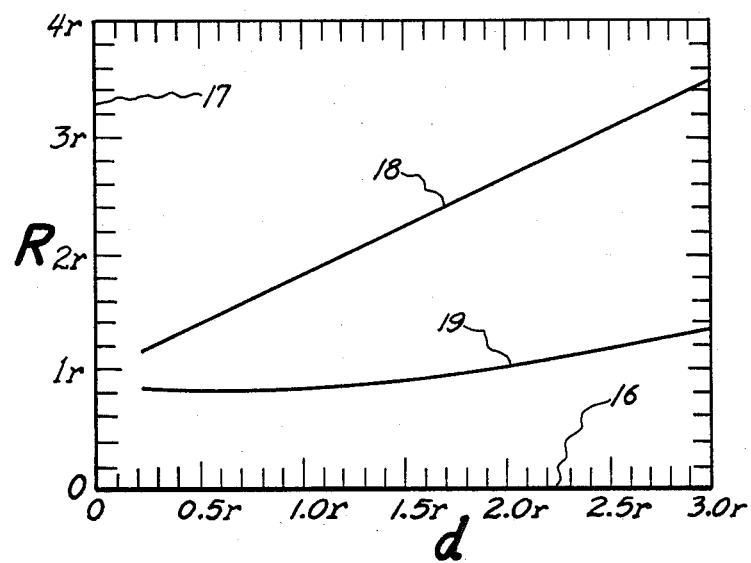

Referring now to FIGS. 2a and 2b, one prior art method by which the examination, e.g. chemical-shift spectroscopy, of voxel 12a, here positioned to be at some depth d below the surface 12s of the sample 12, can be investigated is by use of the Depth-REsolved Surface coil Spectroscopy (DRESS) technique described and claimed in U.S. Pat. No. 4,629,988, issued Dec. 16, 1986 to the assignee present invention and incorporated herein in its entirety by reference. This technique, which combines selective excitation from a volume coil (not shown) and detection with a surface coil 14, positioned adjacent to, or in abutment with, the surface 12s, obtains localized spectra from a disc-shaped sensitive volume 15 parallel to the plane of the coil. Thus, the coil 14 should be positioned such that the desired voxel 12a' is placed at the center of sensitive disc 15; however, since the shape of disc 15 derives from the sensitivity profile of surface coil 14, the disc radius R is often too large to provide sufficient spatial resolution in coplanar directions. That is, the sensitive disc radius R, representing 50% of the total integrated signal from the sample, will have a dimension relatively large compared to the surface coil radius r; the sensitive disc radius R also increases substantially linearly with the depth d of the sensitive disc below the surface coil plane. This relationship is graphically illustrated in FIG. 2b, wherein the disc depth d is illustrated, in multiples of the surface coil radius r, along abscissa 16, while the sensitive disc radius R, in multiples of the surface coil radius r, is plotted along ordinate 17; the curve 18 illustrates that sensitive disc radius R is a substantially linear function of both surface coil radius r and depth d assuming a homogeneous sample much larger than the surface coil. Thus, even if a discoidal voxel 12a' is to be utilized, the voxel radius R' cannot be controlled without changing the NMR surface coil size. It will be apparent that changing the size of a surface coil, especially during an in vivo clinical investigation of a living sample (such as a human patient), not only affects sensitivity but also is an unacceptably inefficient approach, especially for an investigation requiring a set of responses from varying depths d below the sample surface. This is especially so, in that as depth d is increased to be much larger than coil radius r (d>>r), variation of radius r becomes relatively ineffectual in controlling radius R. Advantageously, a voxel radius curve such as curve 19 is desirable, with a voxel sensitivity radius showing little, if any, variation for a reasonably large (e.g. $d \leq 4r$) change in the voxel depth d below the surface coil 14, and which can be controlled to some degree without varying the surface coil radius.

One method for spatial localization to a voxel is described and claimed in U.S. Pat. No. 4,480,228, issued Oct. 30, 1984, assigned to the assignee of the present application and incorporated herein in its entirety by reference, wherein voxel 12a' is localized to the intersection of a pair of planes 15a and 15b, each orthogonal to the other, by following initial NMR excitation with a pair of sequential spin-echo-producing selective excitation π RF pulses, each applied in the presence of a pulse of a magnetic field gradient directed in the associated one of two orthogonal directions, each parallel to the plane of surface coil 14, before the resulting NMR response signal is acquired from the spin echo generated by the second π pulse. However, this method is only applicable to sample components having a sufficiently long NMR spin-spin, or $T_2$, relaxation time so that a reasonable signal magnitude will persist until the second echo time interval following initial excitation. This prohibits use in certain spectroscopic studies, e.g. in phosphorus ($^{31}$P) NMR studies of adenosine triphosphate (ATP) which has in vivo $T_2$ values (on the order of 10 milliseconds) sufficiently short such that a pair of excitation pulses, with an associated pair of gradient pulses and subsequent spin echoes produces little, if any, ATP signal in in vivo $^{31}$P investigations performed to date.

Other solutions, such as the aforementioned ISIS procedure, seek to obviate the need for spin echo acquisitions by the use of selective π inversion RF pulses preceding the NMR excitation sequence. Becaue conventional selective excitation only allows localization in a single dimension at any time, and because inverted and non-inverted response signals cannot be distinguished from a single application of a sequence, full three-dimensional localization must be performed with $2^3=8$ sequential applications of the pulse sequence, and with the various response signals then being added and subtracted to yield the final signal set. The resulting process, of subtraction of relatively large signal amplitudes from whole volumes to yield signals from a much smaller localized volume, is highly susceptible to large errors, especially when physiological motion occurs before the entire sequence is completed. Such a process may therefore be unacceptable for studying areas (such as the heart, chest and torso in general) which are subject to appreciable amounts of physiological motion. Because it is highly desirable to obtain complete three-dimensional localization of spectra, as well as physical motion insensitivity, our invention provides a method whereby spatially-selective excitation can be achieved in more than one spatial dimension in the time interval of a single RF excitation pulse.

Figure 3:
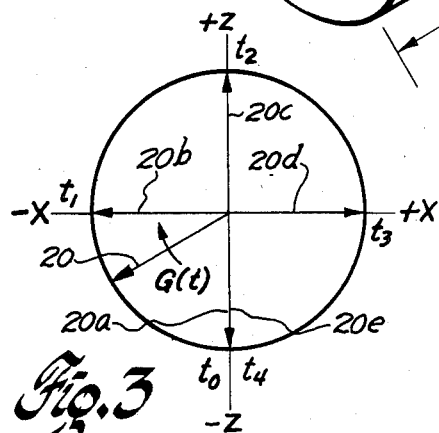
FIG. 3 is a graphical illustration of one type of desired rotating pulse function.

In accordance with the invention, multi-dimensional NMR spatial localization is obtained with a single RF signal pulse, by causing the orientation of an associated magnetic field gradient to be swept through more than one dimension during that single RF pulse application. We have found many combinations of different magnetic field gradient and RF signal pulse waveforms which produce acceptable results, as long as the net gradient vector (produced by the superposition of the component gradient fields supplied in more than one dimension) changes its orientation during application of the single RF pulse. Thus, as shown in FIG. 3, if the net magnetic field gradient G(t) is represented as a vector 20 which has an initial orientation 20a at the initiation of the RF pulse, at time $t_O$ (e.g. in the $-Z$ direction), then the gradient vector can, for one selected pair of gradient signals in the selected directions (e.g. $G_x(t)$ and $G_z(t)$ gradient signals), move in the chosen two-dimensional plane (e.g. the XZ plane). Thus, at another time $t_1$ the vector 20b is now in another direction (e.g. in the $-x$ direction) in that plane, and with continuing motion, temporary vector positions 20c, 20d, 20e, ... are swept out in the plane such that at the associated time $t_2, t_3, t_4,$ ... vector 20 points in other directions (e.g. in the $+z$, $+x$, $-z$, ... directions) in that plane. While the G(t) function amplitude is illustrated as constant, variations in amplitude, and time-dependence thereof, will yield different and desirable two-dimensional spatial-sensitivity profiles.

The macroscopically heterogeneous distribution of nuclear spins in sample 12 can be represented as an array of ensembles of spins with each spin represented by a bulk nuclear spin magnetization M(r) at each point r=(x,y,z), in the laboratory Cartesian coordinate frame of reference. The effect on each ensemble of applying an NMR excitation RF signal pulse in the presence of a magnetic field gradient superimposed on a large static magnetic field 11a, i.e. field $H_oz$, is then given by the Bloch differential equation $$d[M(r',t)]/dt = \gamma M(r',t) \times H(r',t) \quad (1)$$

for time t short compared to the spin-spin relaxation time ($T_2$) and spin-lattice relaxation time ($T_1$) in a local primed frame of reference rotating about an axis parallel to the z axis, at location r and with angular frequency $\omega$ equal to that of the NMR RF excitation field 11b, denoted $H_1(t)$. The net applied magnetic field in the rotating frame is $$H(r',t) = H_1 + [H_o + H_g(r,t) - \omega/\gamma]z' \quad (2)$$

where $H_g(r,t)$ is the Z-axis component of the applied gradient field (X-direction and Y-direction gradient components can be disregarded if their net applied magnetic field amplitude is much less than $H_o$), $\gamma$ is the nuclear gyromagnetic ratio, and $\omega_o = \gamma H_o \sim \omega$ is the Larmor angular frequency. The net magnetization at the cessation of the RF signal pulse, is computed for arbitrary RF pulse and gradient field waveforms, by numerical integration of equation (1) using rotation operators to accommodate the vector product and iterating its differential form:

$$M(t+dt) = R_\phi R_\theta S \, R_\theta^{-1} R_\phi^{-1} M(t) \quad \text{tm (3)}$$

commencing with $M(t=o) = M_o z'$ for spin inversion, where $M_o$ is the equilibrium magnetization at r, $R_\theta^{-1}$ and $R_\phi^{-1}$ transforms the magnetization to a spherical polar coordinate system in the rotating frame in which the net field H is directed parallel to the z axis at r, $$S = \begin{bmatrix} \cos\alpha & \sin\alpha & 0 \\ -\sin\alpha & \cos\alpha & 0 \\ 0 & 0 & 1 \end{bmatrix}$$

nutates M and H by an increment $\alpha = \delta H(t+dt)$, and $$R_\theta = \begin{bmatrix} \cos\theta & \sin\theta & 0 \\ 0 & 0 & 1 \\ -\sin\phi & \cos\phi & 0 \end{bmatrix}$$

and $$R_\phi = \begin{bmatrix} \cos\phi & \sin\phi & 0 \\ -\sin\phi & \cos\phi & 0 \\ 0 & 0 & 1 \end{bmatrix}$$

transform the magnetization back to the original coordinate system with $H_o$ parallel to the Z axis.

In choosing suitable forms for fields $H_1(t)$ and $H_g(r,t)$, the NMR excitation pulse field 11b must be applied transverse to the main $H_o$ field 11a and may therefore possess two components in the rotating frame. Since each of the one or two $H_1$ components can, in general, be modulated by different amplitude-modulation functions $f_{1x}(t)$ and $f_{1y}(t)$ by means of a quadrature NMR transmitter, we write:

$$H_1 = f_{1x}(t)\hat{x}' + f_{1y}(t)\hat{y}'. \quad (4)$$

where denotes the corresponding Cartesian unit vectors. Similarly, the gradient field is set such that $$H_g(r,t) = f_{gx}(t)G_x\hat{x} + f_{gy}(t)G_y\hat{y} + f_{gz}(t)G_z\hat{z} \quad (5)$$

where $G_x$, $G_y$ and $G_z$ are the amplitudes of the gradients in the z component of the magnetic field provided by a conventional NMR imaging system employing linear gradient fields, and $f_{gx}(t)$, $f_{gy}(t)$ and $f_{gz}(t)$ are the amplitude-modulation functions of the respective gradients. The spatial variation, or sensitivity profile, of the magnetization M(r) in the laboratory frame (produced by a particular NMR pulse and gradient field combination) is obtained by substituting equations (5), (4) and (2) into equation (3), for the array of different points (x,y,z).

Figure 3A:
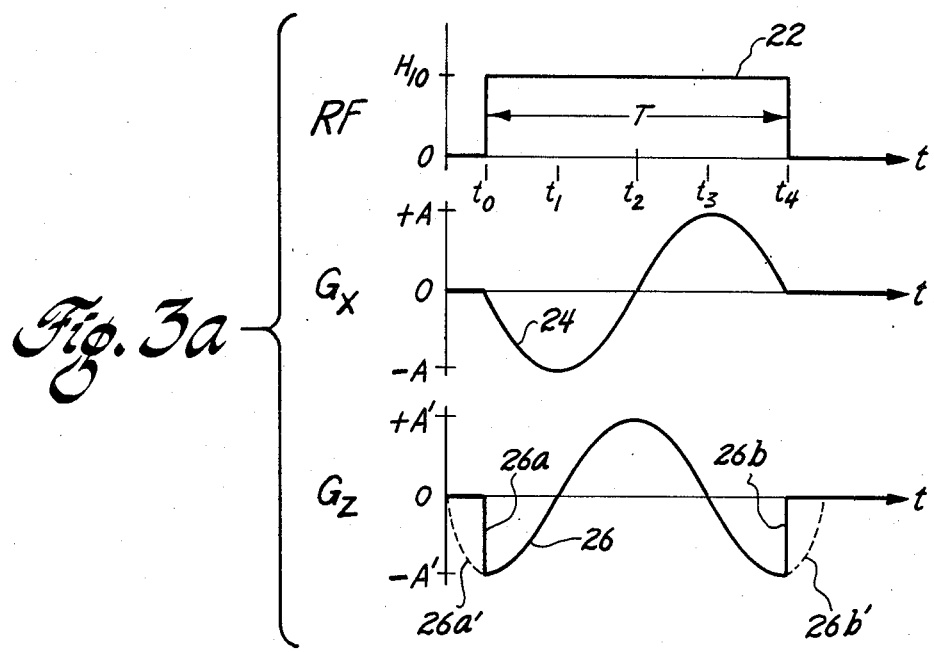
FIGS. 3a and 3b are respective RF and gradient pair signals for producing a first present preferred spatially-selective NMR excitation $\rho$ pulse and the NMR spatial response produced therefrom.
Figure 3B:
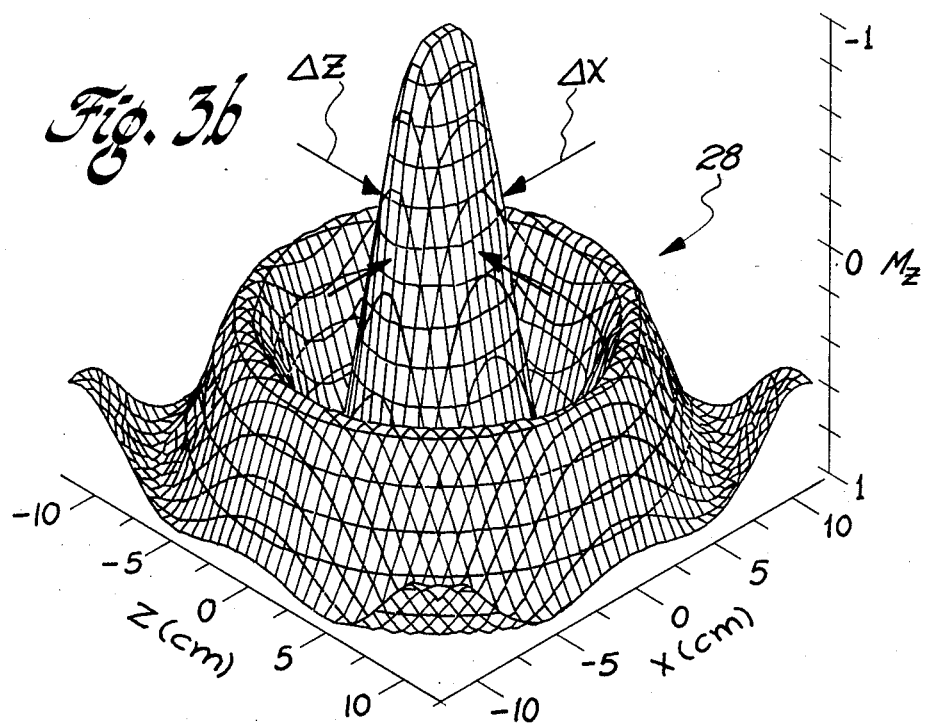

Referring now to FIGS. 3a and 3b, the simplest example of our two-dimensional spatially-selective excitation p pulse comprises a $\pi$, or 180°, RF signal pulse 22, with a rectangular envelope of amplitude $H_{10}$ and a duration T, applied in the presence of a gradient field $H_g$ that rotates through $2\pi$ in the localization plane (illustratively, the xz plane will be used as the localization plane in all examples herein). Thus: $f_{1x}(t)=H_{10}=\pi/\delta T$, and $f_{1y}(t)=0$ during the RF signal pulse 22. The first gradient field function is $f_{gx}(t)=\sin(2\pi t/T)$, with a $G_x$ amplitude A, and the second gradient field function is $f_{gz}(t)=\cos(2\pi t/T)$, with a $G_z$ amplitude A' (here, A=A') from initial time $t_0$ to final time $t_4$. Thus, at initial time $t_0$, RF signal pulse 22 rises to the amplitude $H_{10}$, while the sinusoidal $G_x$ gradient 24 is at a substantially zero amplitude and the cosinusoidal $G_z$ gradient field is at its maximum negative ($-A'=-A$) value. The leading edge 26a of the $G_z$ field function signal may be an abrupt step, as shown, or may, as shown in broken line portion 26a', have gradually increased to the maximum negative amplitude, during a time interval immediately prior to time $t_0$ (the pre-$t_0$ $G_z$ waveform has no substantial effect upon localization, as the RF excitation signal pulse 22 is at a substantially zero amplitude, and localization occurs only when the RF field $B_1$ is present). At a time $t_1$ (after substantially 25% of the excitation time interval T has passed), the $G_x$ waveform 24 has reached its maximum negative ($-A$) value and the $G_z$ waveform has reached a substantially zero value; thereafter, at consecutive times $t_2$, $t_3$ or $t_4$, the $G_x$ waveform reaches respective substantially zero, maximum positive ($+A$) and substantially zero values, while the $G_z$ waveform reaches its associated respective maximum positive ($+A$), substantially zero and maximum negative ($-A$) values. Again, it should be understood that the abrupt termination edge 26b of the cosinusoidal $G_z$ waveform may have a slower transition, as shown by the broken line portion 26b'. It should be noted that, in this case, gradient portion 26b' also has the additional desirable effect of a "crusher" pulse, as described and claimed by Bottomley et al. in U.S. Pat. No. 4,484,138 (issued Nov. 29, 1984), so that portion 26b' aids in attenuating spurious NMR signals that may arise either due to imperfect inversion in selected volume, or due to excitation of transverse magnetization outside the selected volume.

The resulting "Sombrero" two-dimensional spatial response profile 28 for the z component of the magnetization ($M_z$) is plotted in FIG. 3b for gradient amplitudes $A=A'=0.1$ Gauss(G)/cm., a 1 ms. pulse length T and a proton ($^1H$) gyromagnetic ratio, assuming a homogeneous sample and uniform detection. It will be seen that complete spin refocussing or inversion (i.e. $M_z=-1$) is produced along the y axis only at and about the origin (x=0, z=0) of the gradient field. Elsewhere, the z magnetization ($M_z$) is either incompletely inverted/refocused or totally unperturbed in a nearly circularly symmetric pattern. The half height widths of the central portion of the response at $M_z=0$ are approximately given respectively by $\Delta x = 1.8 \times 10^2/(\delta G_x)$ cm. and $\Delta z = 1.5 \times 10^2/\delta G_z$ cm., in the respective x and z directions, which gradient amplitudes $G_x$ and $G_z$ are in G/cm. Thus, the size and shape of the sombrero-shaped sensitivity profile 28 can be controlled by adjusting the gradient strengths and will scale linearly with the gyromagnetic ratio.

Figure 4A:
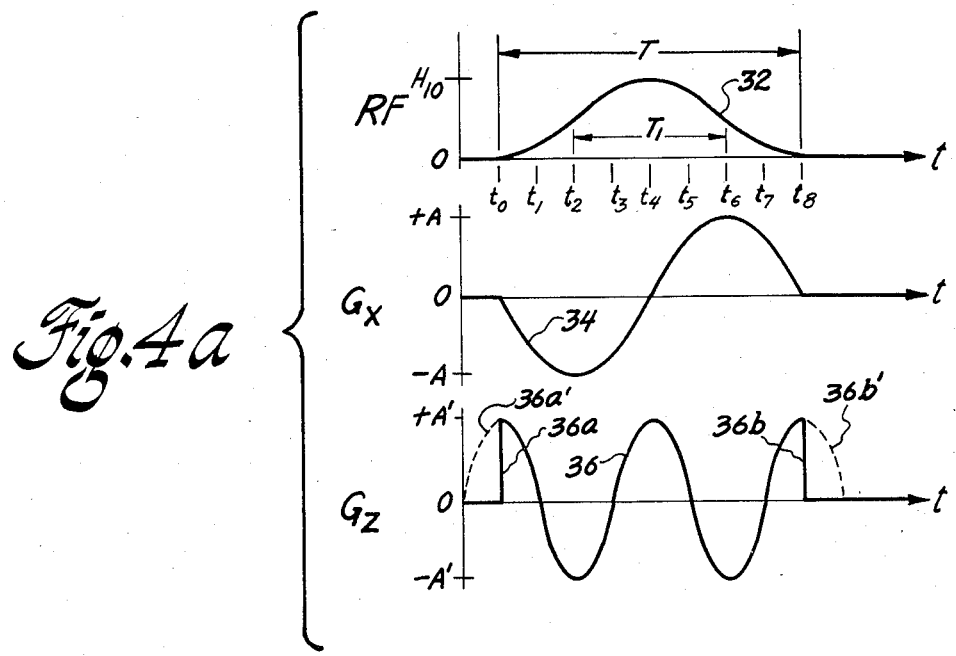
FIGS. 4a and 4b are respective RF and gradient pair signals for producing a second present preferred spatially-selective NMR excitation $\rho$ pulse and the NMR spatial response produced therefrom.
Figure 4B:
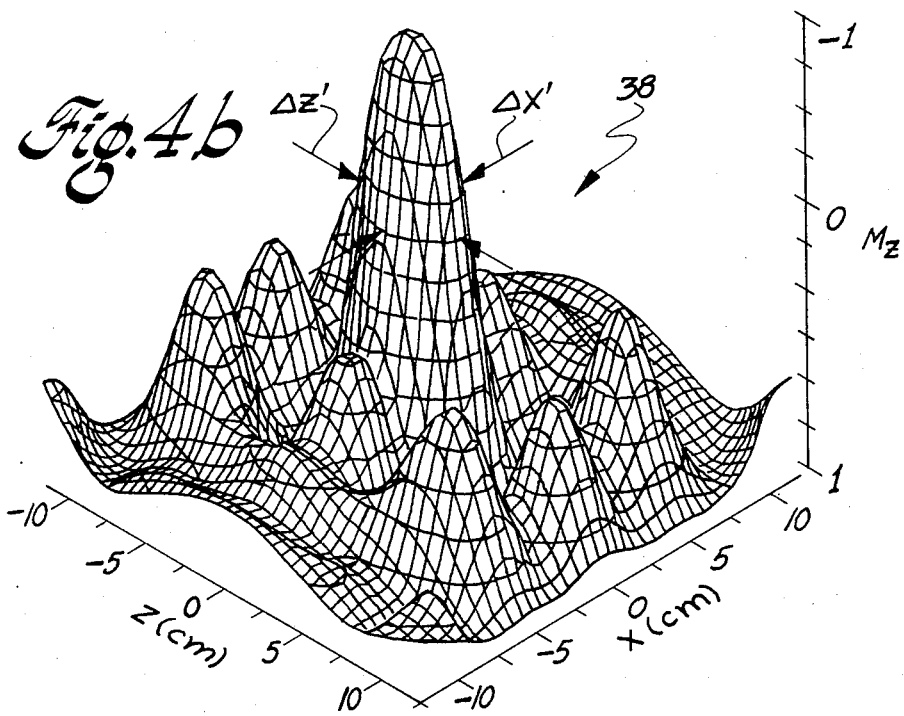

Referring next to FIGS. 4a and 4b, the two-dimensional spatial selectivity can be improved if an amplitude-modulated $\pi$ RF signal pulse 32 with a Gaussian envelope is used. Here, the Full Width Half Maximum (FWHM) time interval $T_1$ is one-half of the total pulse interval T'. Thus, $f_{1x}(t)=H_{10}exp(-[t-t_4]^2/2\sigma^2)$, with $\sigma=T_1/2.36$, and $f_{1y}(t)=0$ for the RF signal pulse 32. The RF signal pulse maximum amplitude $$H_{10} = \pi / \left[ \gamma \int_{t_2}^{t_6} \exp(-[t-t_4]^2/2\sigma^2)dt \right] = \pi/(1.04\gamma T_1),$$

and the gradient field amplitudes A=A'. The first gradient field function is $f_{gx}(t)=\sin(2\pi t/T)$, with a $G_x$ amplitude A, and the second gradient field function is $f_{gz}(t)=\cos(4\pi t/T)$, with a $G_z$ amplitude A'=A.

In FIG. 4b, for A=0.1 G/cm., T=2ms., $T_1=1$ ms. and a $^1H$ gyromagnetic ratio, the "Egg Carton" response profile 38 has complete inversion ($M_z=-1$) only about the origin; away from the origin central perturbation, peaks along the x axis are about half the size of those produced by the "sombrero" pulse, assuming again a homogeneous sample and uniform detection. It will be seen that the z gradient cycles twice during the Gaussian pulse period $T=2T_1$, so the net gradient field vector describes a figure-of-eight in the XZ plane rather than the circle of FIG. 3. The half height widths of the central portion of the response at $M_z=0$ are approximately $\Delta x' = 1.3 \times 10^2/(\delta G_x)$ cm. and $\Delta z' = 1.8 \times 10^2/(\delta G_z)$ cm., where $G_x$ and $G_z$ are in G/cm.

Figure 5A:
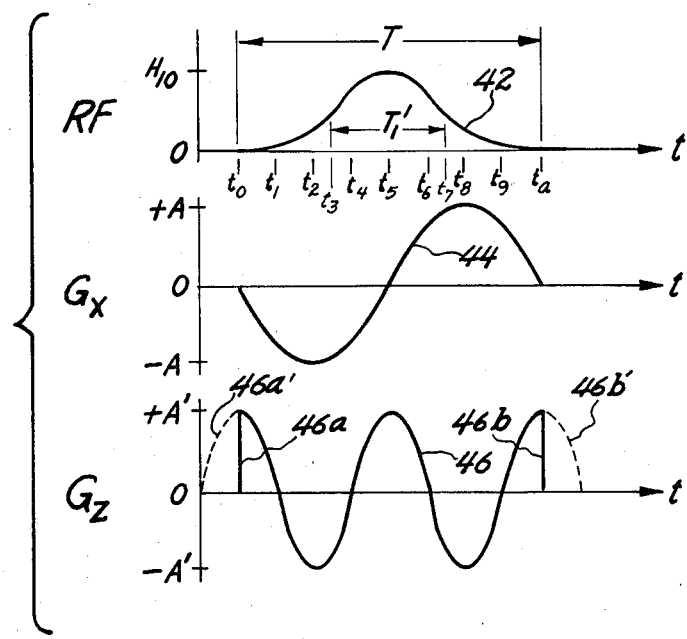
FIGS. 5a and 5b are respective RF and gradient pair signals for producing another present preferred spatially-selective NMR excitation $\rho$ pulse and the NMR spatial response produced therefrom.
Figure 5B:
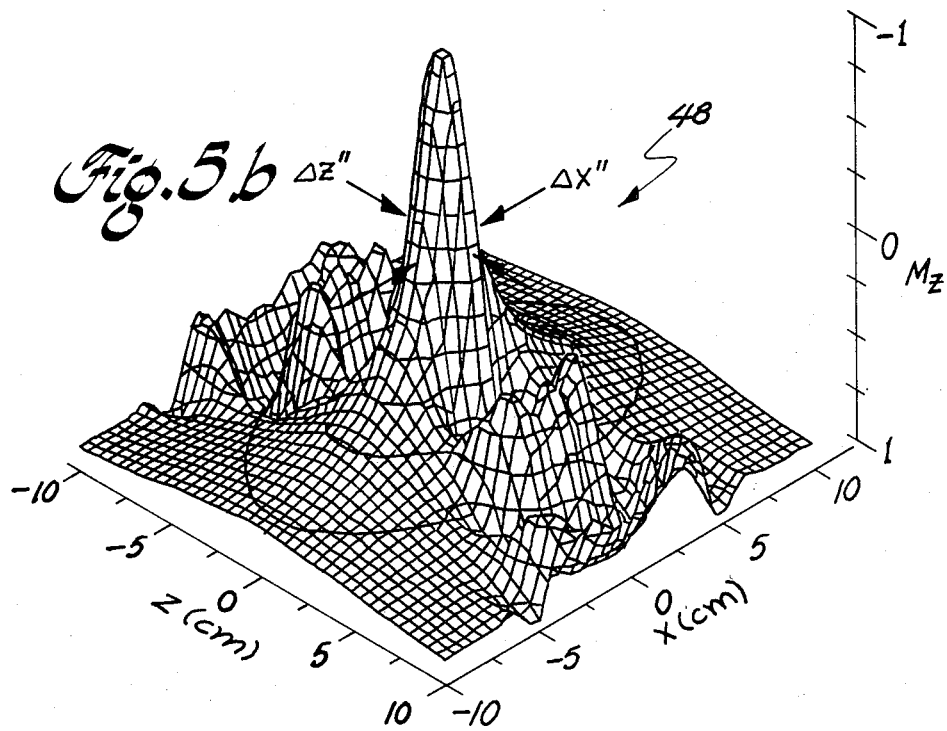

Referring now to FIGS. 5a and 5b, the two-dimensional spatial selectivity is further improved when a Gaussian amplitude-modulated $\pi$ RF signal pulse 42 has a total RF signal pulse time interval T which is three times the duration of the FWHM time interval $T_1'$; the same gradient fields as in the illustration of FIG. 4a are used although here A=2A' (e.g. A=0.1 G/cm. and A'=0.05 G/cm). It will now be seen that the RF signal pulse always has an even symmetry, i.e. is amplitude symmetrical about the temporal midpoint, e.g. time $t_5$, here. Similarly, it will also be seen that one of the gradient functions, e.g. the gradient $G_z$ here, is also a time-symmetrical, or even symmetry, function about the same temporal midpoint, and that the other gradient signal, here the x gradient field $G_x$, is of odd symmetry, or antisymmetrical, i.e. is symmetrical about the temporal midpoint only when the amplitude values for the latter half of the time interval are of opposite polarity from the amplitude values for the time-reflected points in the initial half of the pulse time interval. Thus, with $f_{1x}(t)=H_{10} exp(-[t-t_5]^2/3\sigma^2)$ and $f_{1y}(T)=0$ for the RF signal pulse 42, the peak amplitude $$H_{10} = \pi / \left[ \gamma \int_{t_3}^{t_7} \exp(-[t-t_5]^2/3\sigma^2)dt \right] = \pi/(1.06\gamma T_1').$$

For the sensitivity of profile FIG. 5b, $T_1'$ is 1 millisecond and T is 3 milliseconds. The first gradient field function $f_{gx}(t)=\sin(2\pi t/T)$, with a $G_x$ amplitude A (here, A=0.1 G/cm.), and the second gradient field function is $f_{gz}(t)=\cos(4\pi t/T)$ with a $G_z$ amplitude A' being one-half of the A amplitude (here A'=0.05 G/cm.), from initial time $t_0$ to final time $t_a$, to symmetrize the central lobe half-widths. The third gradient function $G_y$ has a substantially zero amplitude. The resulting "Stalagmite" two-dimensional spatial response profile 48 for $M_z$ is plotted in FIG. 5b, again assuming a homogeneous sample and uniform detection. It will be seen that $M_z$ is substantially equal to $-1$, and complete spin inversion or refocussing is provided along the y axis, only at and about the origin of the gradient field. Elsewhere, the z magnetization is again incompletely inverted or totally unperturbed in a symmetric pattern which, like the pattern of FIG. 4b, has considerably less extent than the toroidal portion of the "sombrero" pulse response 28. It will be seen that the perturbations in the x direction (e.g. the z=0 plane) are considerably less here than in the "Egg Carton" pattern of FIG. 4b. Thus, this pulse response provides spatial localization with a reduced amplitude of excited signals from the undesired volume contributing to the undesirable portion of the response signal. The central portion $M_z=0$ half-height widths are approximately $\Delta x''=1.0\times 10^2/(\delta G_x)$ cm. and $\Delta z''=1.0\times 10^2/(\delta G_z)$cm., where both $G_x$ and $G_z$ are in G/cm.

When these $\pi$ pulses are used as Hahn spin-echo-refocussing $\pi$ pulses, the spatial response function can be derived by dividing the spin ensemble at r into a finite number n of spin packets, each exposed to small variations $\Delta H^i$ in the main static magnetic field $H_o$. This magnetic field inhomogeneity is responsible for the dephasing of the transverse magnetization that the Hahn echo technique is designed to overcome, so that, for the i-th spin packet, $H_o$ is replaced by $(H_o+\Delta H_o^i)$ in equation (2), where the $\Delta H_o^i$ range from $-\Delta H_o^{max}$ to $\Delta H_o^{max}$ in equal increments of $2\Delta H_o^{max}/n$. The magnetization $M^i$ of each packet is then allowed to evolve for a period $T_E=\pi/2\delta H_o^{max}$ in the absence of the excitation and gradient fields $H_1$ and $H_g$, from an initial state $M(t=0)=M_o Y'$. During this period $T_E$, the different spin packets dephase by up to $\pi$ radians in the rotating frame, as shown by equation (3) with $dt=T_E$. At time $t=T_E$, the $\rho$ pulse RF signal and gradient fields are applied for their time interval T; the magnetization can be computed for each packet by iterating equation (3), in manner similar to that for the inversion computed pulse. After a second evolution period $T_E$, the net magnetization M(r) is computed from the vector addition of the contributions from each spin packet; the transverse component of M(r) represents the spin-echo signal, and its two-dimensional spatial distribution is obtained by computing the result for an array of points (x,z) as before. With n=12, the two-dimensional spatial sensitivity profiles of the transverse magnetization $M=(M_x^2+M_y^2)^{\frac{1}{2}}$ for the complete $\rho$ pulses, now employed as spin-echo-refocussing pulses, are the same as those profiles obtained when the $\rho$ pulses are used for inversion, i.e. are those profiles shown in FIGS. 3b-5b, except that the vertical axes for refocussing now range from 0 to $+M_o$ (or, more strictly speaking, from 0 to $M_o e^{2T_E/T_2}$) instead of from $-M_o$ to $+M_o$.

There appear to be a very large number of combinations of RF signal pulse profiles and gradient field modulation waveforms which will provide a $\rho$ pulse characteristic. We have evaluated many of the more conventional types and have determined the following guidelines for designing two-dimensional spatially-selective inversion or refocussing $\rho$ pulses: (i) two-dimensional localization is not achieved when equivalent gradient field modulation functions $f_{gx}(t)$ and $f_{gz}(t)$ are used; (ii) in the limit of large numbers (i.e. more than about 5) of gradient modulation cycles completed in the RF pulse time interval T, the localization profiles excited by many NMR $\rho$ pulse types are similar or comparable to the "sombrero" $\rho$ pulse of FIGS. 3a and 3b; (iii) the aspect ratio of localization profiles can be changed by varying either the relative gradient field strengths, e.g. the ratio $g_x/g_z$, or the relative gradient field modulation frequencies; (iv) sinc-modulated and sech-modulated NMR $\rho$ pulses do not produce two-dimensional localization except in the high-frequency gradient field modulation limit noted in (ii) above; (v) two-dimensional localization is possible with gradient field modulations that cycle less than once during a single RF signal pulse time interval T; (vi) other orthogonal gradient field waveforms, such as square and ramp functions, also produce two-dimensional localization; and (vii) as practical considerations, the selection of gradient field waveforms and modulating frequencies is limited by the experimental response characteristics of the NMR system magnetic field gradient coils and the amplifiers which drive them, while the RF signal pulse duration T is limited by the requirement that $T<<T_2$ and by magnetic field inhomogeneity or chemical shift dispension in the selected region.

Figure 6A:
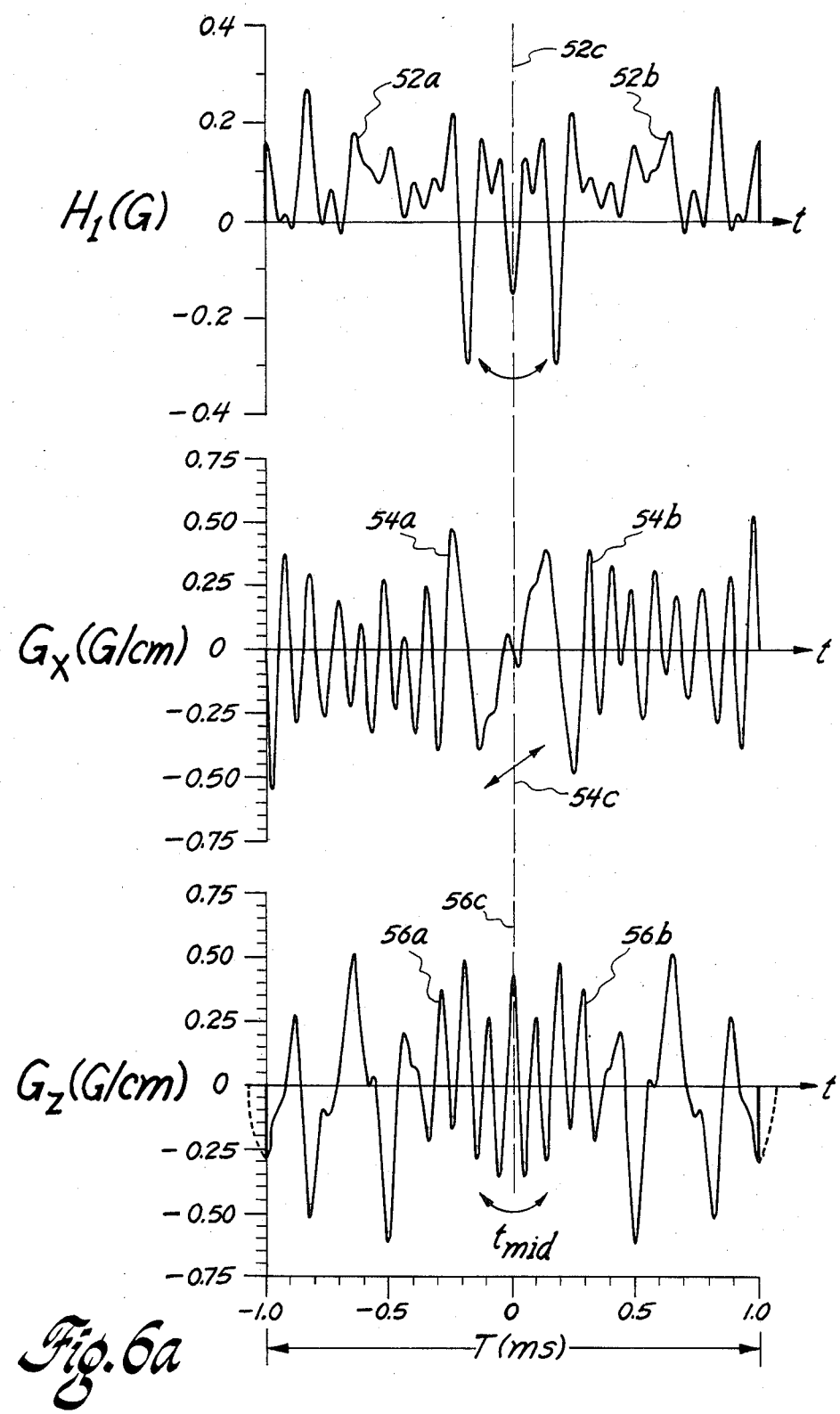
FIGS. 6a, 6b and 6c are respective RF and gradient pair signals for producing yet another presently preferred spatially-selective NMR excitation $\rho$ pulse, an ideal NMR spatial response useful in obtaining signals by our method, and an actual optimized spatial NMR response produced therefrom.
Figure 6B:
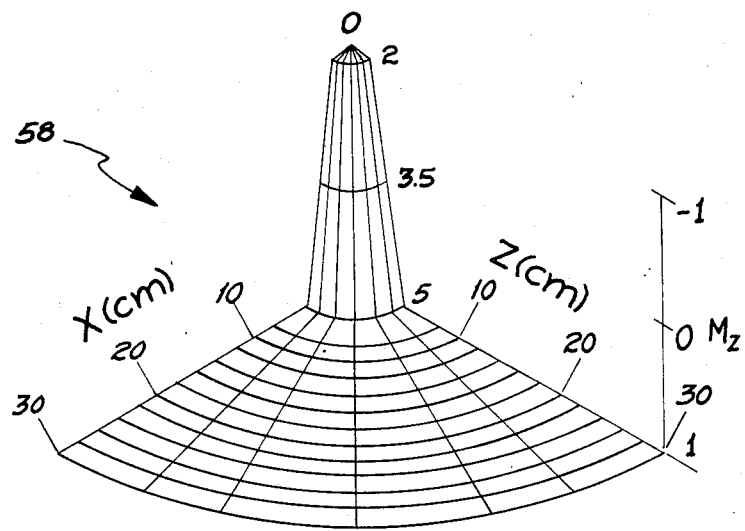
Figure 6C:
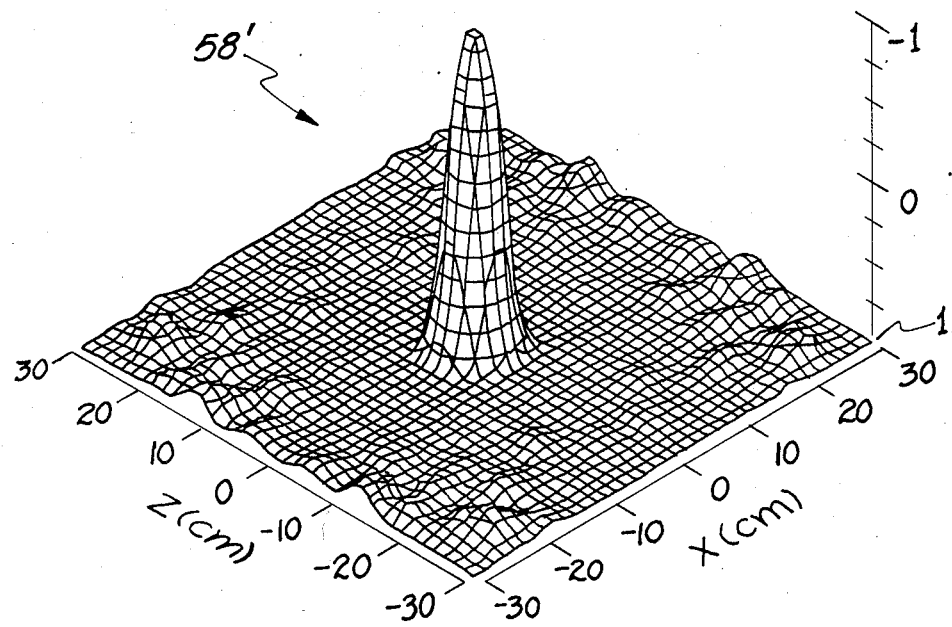

The ideal two-dimensional spatial response function may be considered to be a square or cylindrical rod with normalized z component of magnetization $M_z=-1$ in the center of the plane (x=0,z=0) and with zero sensitivity ($M_z=1$) everywhere else. We have chosen as an objective function a slight compromise from the ideal, namely a tapered cylinder, one quadrant of which is illustrated in FIG. 6c. We begin synthesis of this "Monad" function $\rho$ pulse by comparing the actual achieved response magnetization 58' with the objective response 58; this comparison can be made by sampling each response at a multitude of similar points, as shown in FIG. 6b, e.g. on a multi-spoke radial grid covering one quadrant of the xz plane, with a plurality P of points sampled along each of S different grid spokes. Constraints (outlined below) on the RF signal and gradient field waveforms produce reflection symmetry about the x and z axes in the sensitivity profile, making it possible to restrict sampling to just one quadrant of the profiles. A cost function $\epsilon$ is then taken to be the sum of the absolute values of the difference between the actual profile f (e.g. that of FIG. 6c) and the objective response f' (e.g. that of FIG. 6b) at each of the PxS total points, i.e.

$$\epsilon = \sum_{j=1}^{P\times S} |f_j - f'_j|. \tag{6}$$

To produce a more concise characterization of the RF signal envelope and gradient field waveforms, we expand each waveform as Fourier sine and cosine series with a limited number of terms, e.g. 24 terms. This yields $$H_1(t) = \sum_{i=0}^{24} B_i \cos(i\theta_t), \tag{7}$$

$$G_x(t) = \sum_{i=1}^{24} C_i \sin(i\theta_t) \tag{8}$$

and $$G_z(t) = \sum_{i=0}^{24} D_i \cos(i\theta_t), \tag{9}$$

with $\theta_t=2\pi t/T$. The choice of an odd-symmetry sine series for $G_x$ and an even-symmetry cosine series for $G_z$ was made to insure orthogonality of the two gradients; the choice of an even-symmetry cosine amplitude-modulation envelope for the RF excitation signal allows use thereof for a refocusing pulse as well as for an inverting pulse. The Fourier coefficients {$B_i$, $C_i$, $D_i$} can be concatenated into a single array {$A_i$} here of 74 terms, which array specifies the entire input function. We now apply simulated annealing and treat the optimization as a thermodynamic process with the cost function $\epsilon$ analogous to energy. Take as an example the case of a large number of interacting molecules with coordinates {$r_i$}. The energy of the system corresponding to a given configuration can be specified as $E(\{r_i\})$ Then the mean state of the system in thermal equilibrium at temperature $T_k$ will be the average over all configurations, with each one weighted by its Boltzmann factor exp($-E(\{r_i\})/kT_k$), where k is Boltzmann's constant. It is clear that for low temperatures, the low energy states of the system are favored. However, if the temperature is lowered too quickly the system may be trapped in a more elevated state. This can be avoided by annealing the substance, that is, by first melting it and then slowly lowering the temperature, spending a long time near the freezing point. This procedure allows equilibrium at each temperature and insures a low energy state at the end of the annealing process. Similarly, in the optimization problem the goal is to reach the "low cost-function states" of the system. In our case the array of Fourier coefficients {$A_i$} is analogous to the positions of the molecules {$r_i$} in the above example. An effective temperature $T_k$ can be specified which is used as a control parameter in the same units as the cost function. Following the cost function gradient down to a minimum is analogous to suddenly lowering the temperature, and will in general leave the system trapped in a local minimum. However, allowing the cost function to have controlled uphill steps as well as downhill steps allows the system to escape local optima. The probability of uphill steps is determined by a Boltzmann distribution $\exp(-\Delta\epsilon/T_k)$. If the temperatue of the system is gradually lowered under these conditions, the system will find its lower energy states, and simulated annealing will have occurred.

Our specific annealing algorithm first chooses a maximum step size $\Delta_A$ for the coefficients {$A_i$}, such that the steps produce reasonably sized changes in the magnetization profile; then, we generate a random change in a given coefficient $A_i$ by calculating $A_i' = A_i R_1 \Delta_A$, where $R_1$ is a random number between $-1$ and 1, and we determine a new value of cost function $\epsilon'$ using the new $A_i'$. The new cost function value $\epsilon'$ is compared to the old value $\epsilon$; if $\epsilon' \geq \epsilon$, then $A_i'$ is accepted; if $\epsilon' \geq \epsilon$, then an acceptance probability $P_a = \exp(-(\epsilon'-\epsilon)/T_k$ is computed. The decision whether to accept is then based on generation of a second random number $R_2$ between 0 and 1. If $R_2 \geq P_a$ then $A_i'$ is accepted; otherwise the old value $A_i$ is retained before starting the next iteration of the algorithm. This basic step is repeated for each member of the coefficient array {$A_i$}, and the array stepped through many times at one temperature. In this manner the system is made to behave in an analogous manner to molecules in contact with a themal reservoir at temperature $T_k$. At the end of many cycles, the system will have evolved into a Boltzmann distribution, i.e. reached thermal equilibrium. Annealing is accomplished by first performing this algorithm at high temperature and then repeating it many times as the temperature is gradually stepped down through the "freezing point". At the end of this process the system will have settled in one of its lower energy states, i.e. in a global minimum. To extend the analogy further, it is possible to calculate the heat capacity C at each temperature. Thus, $$C(T_k) = d<\epsilon(T_k)>/dT_k, \qquad (10)$$

where $<\epsilon(T_k)>$ is the average cost function at temperature $T_k$. A rise in C as the temperature is lowered indicates that a phase transition is occurring, warranting a slowing down of the temperature stepping.

Simulated annealing was performed on a Data General MV10,000 computer; the Sombrero $\rho$ pulse 28 of FIGS. 3a and 3b used as a starting function. The starting temperature was determined by generating random variations in the array values $A_i$ and taking one-half of the average of the resulting cost function changes. The temperature was then stepped down to zero in 15 equal steps, with 20 passes through the array at each temperature. The optimization was complete after roughly one day of computation on a timeshared machine. A typical one of the set of optimized "Monad" $\rho$ pulses is generated by the RF signal 52 and $G_x$ gradient field signal 54 and $G_z$ gradient field signal 56 of FIG. 6a. FIG. 6c shows the two-dimensional sensitivity profile 58 for that typical monad $\rho$ pulse generated by the signals of FIG. 6a, using the objective function shown in FIG. 6b, with S=7 spokes and P=12 points per spoke. Tables of the $B_i$, $C_i$ and $D_i$ Fourier coefficients for four of the class of annealed monad $\rho$ pulses are set forth in Tables I–IV below. Those skilled in the electronic waveform generation arts will recognize that, because of the symmetry of the $B_1$ portions 52a and 52b, the $G_x$ signal portions 54a and 54b and the $G_z$ signal portions 56a and 56b, respectively about the temporal midpoint lines 52c, 54c and 56c, all at time $t_{mid}$, only the first half of each of the waveforms need be digitized, stored in RAM/ROM and read therefrom. Thus, the amplitudes at a large number M of times, e.g. at M=200 time points, each separated by a time interval $t_S$ equal to half the time interval T divided by the number M of time points, e.g. an interval of 5 sec., can be stored for each of the three signals, can be read at a read frequency substantial equal to the reciprocal of the storage interval $t_S$, e.g. at 200 KHz, with addresses increasing in the first half of the pulse time interval T and can then be re-read with decreasing addresses (and polarity inversion of the $G_x$ signal values) in the latter half of interval T.

TABLE I

| Fourier Coefficients $B_i$, $C_i$ and $D_i$ for Monad $\rho$ Pulse #1 | | | |
|---|---|---|---|
| i | $B_i$ ($H_1$) in mG | $C_i$ ($G_x$) in mG/cm | $D_i$ ($G_z$) in mG/cm |
| 0 | 62.2 | — | −7 |
| 1 | −28.2 | 42 | 57 |
| 2 | −26.3 | 6 | −21 |
| 3 | 5.8 | 2 | 36 |
| 4 | 6.9 | 49 | −70 |
| 5 | 5.6 | 70 | −94 |
| 6 | 3.2 | 89 | 120 |
| 7 | 38.6 | 89 | −3 |
| 8 | −6.0 | 15 | −116 |
| 9 | −26.2 | −22 | 163 |
| 10 | −16.0 | −66 | 17 |
| 11 | −81.8 | −25 | 2 |
| 12 | −7.6 | −86 | −66 |
| 13 | −42.5 | −43 | 60 |
| 14 | −5.2 | 42 | 48 |
| 15 | 11.7 | 56 | −3 |
| 16 | 37.9 | 10 | −21 |
| 17 | 27.0 | 21 | −86 |
| 18 | −7.5 | −113 | 93 |
| 19 | 10.0 | 65 | 58 |
| 20 | −25.0 | −146 | 57 |
| 21 | −34.7 | 117 | 134 |
| 22 | −23.2 | 52 | 96 |
| 23 | −50.3 | −7 | 54 |

TABLE I-continued

Fourier Coefficients $B_i$, $C_i$ and $D_i$ for Monad $\rho$ Pulse #1

| i | $B_i$ ($H_1$) in mG | $C_i$ ($G_x$) in mG/cm | $D_i$ ($G_z$) in mG/cm |
|---|---|---|---|
| 24 | 8.7 | −116 | −66 |

TABLE II

Fourier Coefficients $B_i$, $C_i$ and $D_i$ for Monad $\rho$ Pulse #2

| i | $B_i$ ($H_1$) in mG | $C_i$ ($G_x$) in G/cm | $D_i$ ($G_z$) in G/cm |
|---|---|---|---|
| 0 | 61.8 | — | −10 |
| 1 | −22.6 | 56 | 61 |
| 2 | 3.4 | 34 | −5 |
| 3 | −24.4 | 21 | 21 |
| 4 | −15.4 | 29 | 51 |
| 5 | −4.6 | 76 | 14 |
| 6 | −14.0 | 52 | 56 |
| 7 | −20.4 | −52 | 104 |
| 8 | 33.4 | −11 | 72 |
| 9 | −28.0 | 33 | −88 |
| 10 | −1.3 | −76 | −30 |
| 11 | 20.7 | −22 | 62 |
| 12 | 10.4 | 58 | 310 |
| 13 | −15.1 | 49 | 134 |
| 14 | −17.7 | −196 | −5 |
| 15 | 34.4 | 32 | −65 |
| 16 | −4.7 | −82 | 85 |
| 17 | −9.8 | −35 | −93 |
| 18 | −0.8 | 95 | −116 |
| 19 | 26.5 | 102 | 52 |
| 20 | 24.4 | 54 | −113 |
| 21 | −12.5 | −168 | −169 |
| 22 | −40.2 | −311 | 211 |
| 23 | 7.2 | 106 | 53 |
| 24 | 19.6 | −138 | 67 |

TABLE III

Fourier Coefficients $B_i$, $C_i$ and $D_i$ for Monad $\rho$ Pulse #3

| i | $B_i$ ($H_1$) in mG | $C_i$ ($G_x$) in G/cm | $D_i$ ($G_z$) in G/cm |
|---|---|---|---|
| 0 | 63.3 | — | −10 |
| 1 | −82.6 | 53 | 55 |
| 2 | 29.3 | 0 | −9 |
| 3 | 32.1 | 22 | −15 |
| 4 | 12.1 | −50 | 53 |
| 5 | −47.1 | 12 | 15 |
| 6 | −71.9 | 204 | −35 |
| 7 | −20.2 | −119 | −39 |
| 8 | 39.4 | 249 | 107 |
| 9 | −72.8 | 84 | 40 |
| 10 | 22.6 | −99 | −51 |
| 11 | −45.3 | −9 | −61 |
| 12 | −26.0 | 238 | 10 |
| 13 | 25.6 | 307 | 102 |
| 14 | −71.1 | 190 | 81 |
| 15 | 73.0 | −253 | 98 |
| 16 | −3.0 | 30 | −54 |
| 17 | 68.6 | −78 | −91 |
| 18 | −38.9 | −43 | −31 |
| 19 | −43.1 | −5 | 78 |
| 20 | 39.4 | 69 | 170 |
| 21 | 8.9 | 15 | 127 |
| 22 | −79.4 | 5 | 76 |
| 23 | 74.5 | 55 | 73 |
| 24 | −27.7 | −255 | 3 |

TABLE IV

Fourier Coefficients $B_i$, $C_i$ and $D_i$ for Monad $\rho$ Pulse #4

| i | $B_i$ ($H_1$) in mG | $C_i$ ($G_x$) in G/cm | $D_i$ ($G_z$) in G/cm |
|---|---|---|---|
| 0 | 59.0 | — | 23 |
| 1 | −17.6 | 433 | 439 |
| 2 | 20.3 | −176 | 427 |
| 3 | 11.7 | 431 | 280 |
| 4 | −5.0 | −171 | −87 |
| 5 | −14.8 | −67 | −92 |
| 6 | 34.8 | 38 | −68 |
| 7 | −7.5 | 22 | 5 |
| 8 | −50.9 | −27 | −24 |
| 9 | −1.6 | 1 | 42 |
| 10 | 116.1 | 4 | −12 |
| 11 | −130.5 | −12 | 10 |
| 12 | −86.5 | 8 | −20 |
| 13 | 175.8 | 4 | 2 |
| 14 | −2.2 | 7 | −35 |
| 15 | −265.4 | −3 | 11 |
| 16 | 91.5 | 4 | 0 |
| 17 | −146.9 | −11 | 19 |
| 18 | −512.5 | −10 | 4 |
| 19 | 0.8 | −16 | 13 |
| 20 | −568.2 | 4 | −6 |
| 21 | −169.5 | −2 | −8 |
| 22 | −156.2 | 9 | −8 |
| 23 | 362.0 | −1 | −1 |
| 24 | −26.4 | 4 | 9 |

Figure 7B:
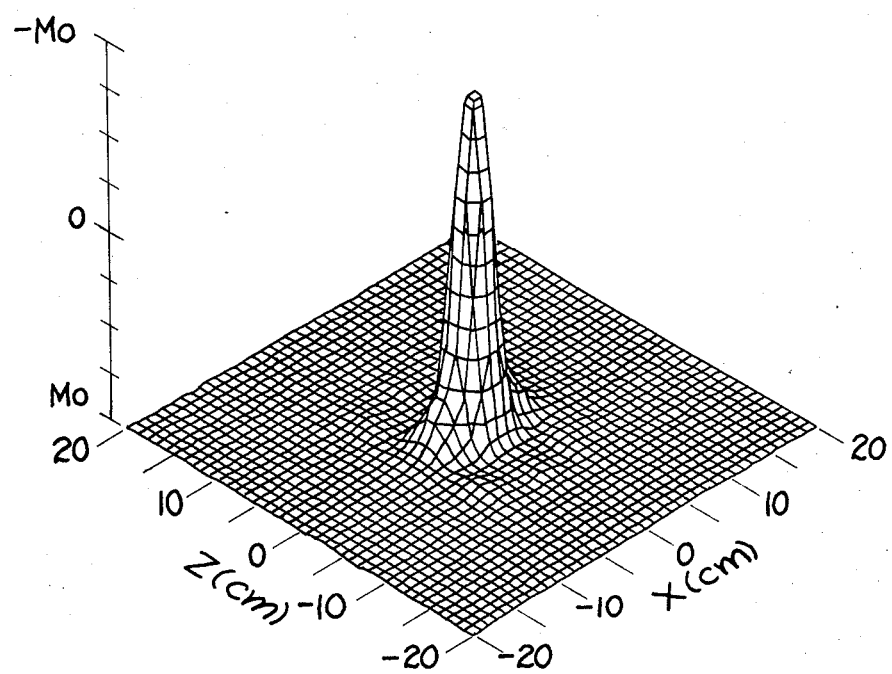
FIG. 7b is an NMR spatial response obtained from NMR excitation with an egg carton ρ pulse and with NMR response signal detection with a surface coil.
Figure 7A:
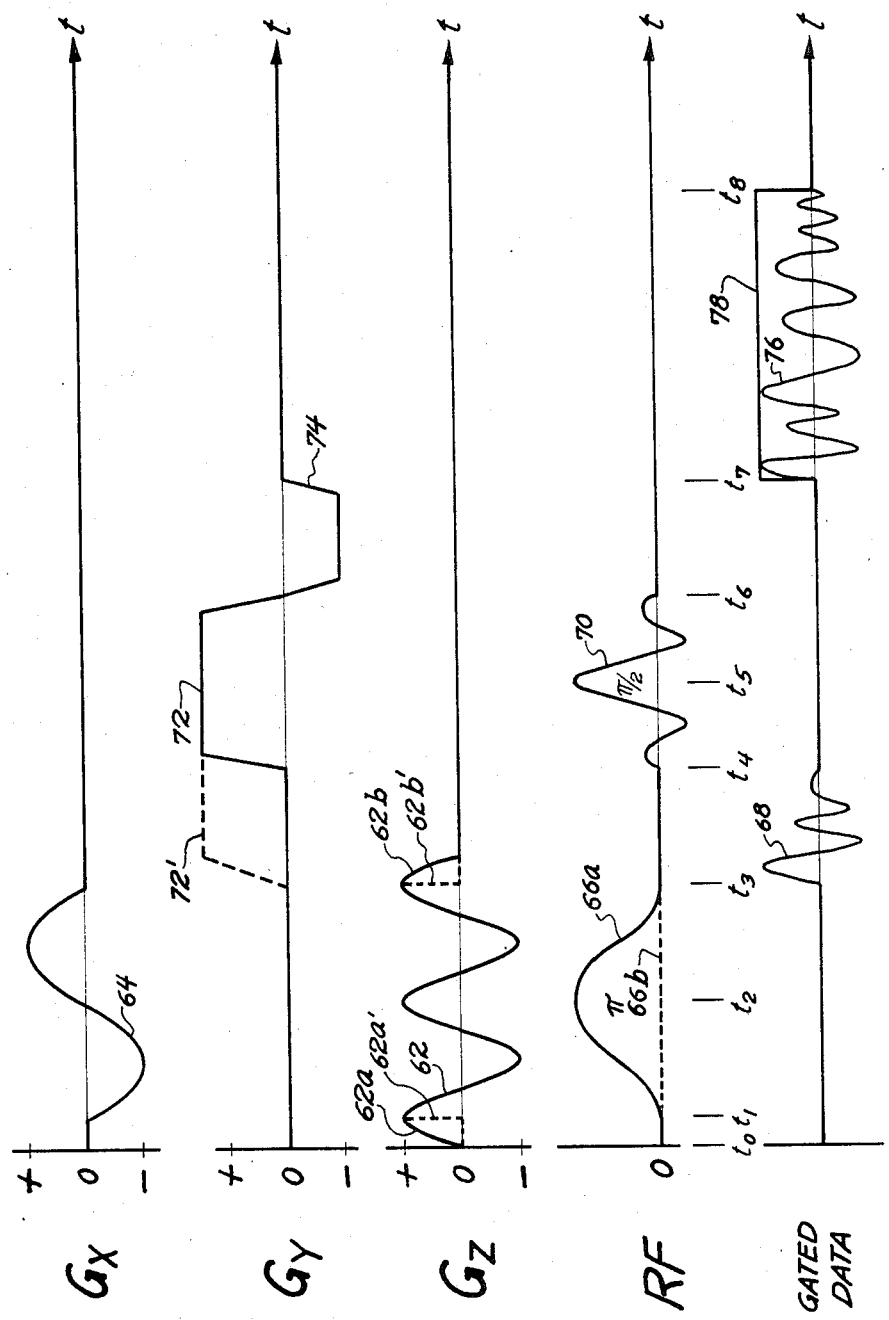

Referring now to FIG. 7a, a first example of the use of a rotating-gradient $\rho$ pulse is used with a conventional DRESS one-dimensional localizational sequence to provide a Point-resolved ROtating GRadiEnt Surface coil Spectra (PROGRESS) sequence for obtaining $^{31}P$ spectroscopy data from a volume completely localized, in three dimensions, to a sensitive disc. The size of the sensitive disc is controllable independent of disc separation from the surface coil. The entire sequence uses a pair of subsequence applications, with alternating subsequences respectively having the rotating-gradient $\rho$ pulse present and absent, respectively, and with the difference in response signals therebetween being taken to provide the fully localized response data. The first subsequence commences with a rotating-gradient $\rho$ pulse, in the time interval between time $t_1$ and time $t_3$. Here, the $\rho$ pulse is illustratively the "egg carton" pulse of FIG. 4: the $G_z$ gradient signal waveform $G_2$ starts at sequence commencement time $t_0$, so that a gradual leading edge 62a occurs, rather than the abrupt edge 62a; the cosinusoidal gradient field signal is at a positive amplitude maxima at time $t_1$, when the $\rho$ pulse commences; the sinusoidal $G_x$ gradient field signal 64, commencing at a substantially zero value at time $t_1$, does not need the pre-commencement waveform portion 62a, allowing use in a practical NMR system in which gradient slew rate is limited to a finite value; the RF signal pulse 66a, with Gaussian envelope, commences at time $t_1$, raises its maximum at time $t_2$ and decays to a substantially zero minimum at pulse termination time $t_3$. The $\pi$ rotating-gradient pulse subsequence, from time $t_1$ to time $t_3$, thus substantially inverts the spins only of a cylinder of the sample parallel to the y axis, which is the surface coil axis, for this DRESS procedure. A short time interval, from time $t_3$ to time $t_4$, is provided, both for the termination of the cosinusoidal $G_z$ rotating pulse gradient portion 62b, and for the termination of a spurious NMR signal 68 which originates from uninverted spins. As previously noted, spurious NMR attenuation can be provided with the use of portion 62b' as a "crusher" pulse; the same results can be achieved with an additional gradient "crusher" pulse 72' in the $G_y$ gradient, from time $t_3$ to time $t_4$. The DRESS portion of the subsequence commences, at time $t_4$, with a $\pi/2$ RF signal pulse 70, here of the sinc-envelope form, provided substantially simultaneously with a $G_y$ gradient signal pulse 72 with amplitude selected for localization to voxels in a plane at a desired distance d below the surface coil plane. After the third-dimension localizing RF signal pulse 70 and gradient pulse 72, a refocusing gradient signal pulse 74 is provided in the $G_y$ gradient, from time $t_6$ to time $t_7$. Thereafter, the now three-dimension-localized NMR response signal 76 emanates from the discoidal voxel selected by the x, z and y planes responsive to the amplitudes of the respective $G_x$, $G_z$ and $G_y$ gradient signals. This localized NMR response signal 76 is gated, at the NMR spectrometer receiver, with a reception gate 78, and the desired NMR data waveform 76 is received, in the time interval from time $t_7$ to time $t_8$, and processed in manner well known to the art. In the second subsequence of the PROGRESS sequence, the first subsequence is repeated with a RF Gaussian pulse 66b of substantially zero amplitude, such that the rotating-gradient $\rho$ pulse is not effectively present, e.g. with the RF signal Gaussian pulse turned off. The $G_x$ and $G_z$ signal pulses 62 and 64, are present, even though the rotating-gradient pulse inversion is not desired in this second subsequence, in order to maintain any spurious induced eddy-current fields from the gradient pulses with substantially the same magnitude in each application of each subsequence to the sample. There will be no initial inversion of spins in the x-z plane and no production of the spurious NMR signal 68 in the second subsequence, which has the same NMR properties as a conventional DRESS sequence, presented from time $t_4$ to time $t_8$. The set of response data obtained from this second subsequence is subtracted from the response data obtained from the first subsequence, and the result thereof is processed, display, stored or otherwise utilized as well known in the art. Thus, the radius R' (of FIG. 2a) of the discoidal voxel 12a' is determined by the $G_x$ and $G_z$ amplitudes in the rotating-gradient $\rho$ pulse portion of the first subsequence, while thickness t is determined by the characteristics of the selective $\pi/2$ RF signal pulse 70 of the DRESS portion of the subsequences. It will be appreciated that, using $\rho$ pulses for spatial localization in NMR spectroscopy, since the detected spectroscopy signal represents the integrated response from the sample, it is desirable to minimize the integrated signal contributions from outside the region selected by the $\rho$ pulse. This minimization is the objective of the "monad" $\rho$ pulse optimized by the simulated annealing procedure. The use of NMR surface coils for detection will also significantly attenuate signals from outside the selected voxel, due to the non-uniform detection sensitivity profile of the surface coil itself. For example, if the PROGRESS sequence of FIG. 7a is used with a surface coil 14, of radius r equal to one-half the FWHM of the "egg carton" $\rho$ pulse response in FIG. 4b, the total response signal spatial function is then given by the profile of FIG. 7b, with off-axis signal contributions being substantially attenuated, compared with the contributions of FIG. 4b. Here, the voxel disk 12a' radius R', representing 50% of the total integrated signal, is that radius of desirable curve 19 of FIG. 2b; radius R' is substantially constant as a function of depth d.

It will be seen that the same sequence can be utilized with the SLice-InTerleaved Depth REsolved Surface coil Spectroscopy (SLIT-DRESS) procedure as described by Bottomley et al. (64 J. Magn. Reson. 347 (1985)), by varying the depth of the selective $\pi/2$ RF signal pulse 70 in consecutive sequences, in manner now well known to the art. It will also be seen that the rotating-gradient $\rho$ pulse sequences can be extended to rotating frame zeugmatography, by replacing the selective $\pi/2$ RF signal pulse and $G_y$ gradient signal with a conventional RF excitation pulse, of amplitude given by the rotating frame zeumatography sequencing procedure well known to the art and exemplified, e.g. by Blackledge et al. in 84 Proc. Natl. Acad. Sci. U.S.A. (1987) and references therein. It will be further seen, that compared to a localization procedure such as ISIS, the number of sequence cycles required for complete three-dimensional localization has been reduced from the normal eight cycle sequence of ISIS, to a mere 2 cycles for PROGRESS, while the amount of excited signals from the entire volume has been reduced by a factor greater than the ratio of the sample dimension to the thickness of the selective slices in the DRESS or rotating-frame zeugmatography procedures. This latter reduction significantly reduces physiological motion artifacts.

Referring now to FIG. 8, a rotating-gradient $\rho$ pulse (here, the "egg carton" pulse) has been incorporated as an inversion pulse in an NMR imaging sequence. The sequence consists of two subsequences, one containing the two gradients and the RF signal of the $\rho$ pulse and the other devoid of at least the RF signal of the $\rho$ pulse. The $\rho$ pulse defines the X and Z limits of the volume to be imaged in the x and z directions. Thus, the first subsequence commences, at time $t_0$, with the initial leading edge 82a of the cosiusoidal gradient waveform 82, here the $G_Z$ waveform, to overcome the high gradient slew rate which would be required for a rapid leading edge 82a'. At inversion pulse start time $t_1$, the cosinusoidal $G_Z$ gradient commences, as does the sinusoidal $G_X$ gradient 84 and the Gaussian envelope of the $\pi$ RF signal pulse 86a. After peaking at midpulse time $t_2$, the $\rho$ pulse terminates at time $t_3$. A short time later, at time $t_4$, the finite-slew-rate gradient trailing edge 82b' ends and an imaging portion, here a well-known spin-echo imaging portion, commences: A sinc-envelope $\pi/2$ RF pulse 88 occurs between time $t_4$ and time $t_6$, along with a dephasing gradient lobe in the remaining direction, e.g. here a $G_y$ lobe 90 in the Y direction, with an amplitude defining the limits of the image volume in the third dimension. From time $t_6$ to time $t_7$, a rephasing lobe 92 occurs in the same gradient ($G_y$). Thereafter, one of a plurality of phase-encoding gradient pulses is applied to provide spatial encoding in the Z direction by a present value of a $G_z$ signal lobe 94a, of a plurality of such lobes 94a-94g at the same time that a $G_x$ gradient pulse 95 is present, from time $t_7$ to time $t_8$. Alternatively, gradient portions 92, 94 and 95 may, as well known in the art, be applied substantially simultaneously or sequentially at any time in the time interval from time $t_6$ to time $t_8$. Gradients $G_x$ and $G_z$ are allowed to decay and an inversion $\pi$ RF signal pulse 96, from time $t_9$ to time $t_a$ is provided prior to a readout $G_x$ gradient signal 98 being provided while the spin echo response signal 98 is received and processed, when the RF spectrometer receiver is gated open, from time $t_b$ to time $t_c$, by its data gate 99. The resulting data is stored; subtracted therefrom is data acquired responsive to a second sequence, which is identical to the above-described sequence, with the exception that the initial two-dimensional inversion pulse (from time $t_1$ to time $t_3$) is effectively removed, as by reduction of the RF signal pulse amplitude to zero, as shown by portion 86b. This double-subsequence set is repeated for all values of the $G_z$ phase-encoding lobe 94; the set of difference data thus obtained is displayed to provide an inversion recovery image.

Figure 9:
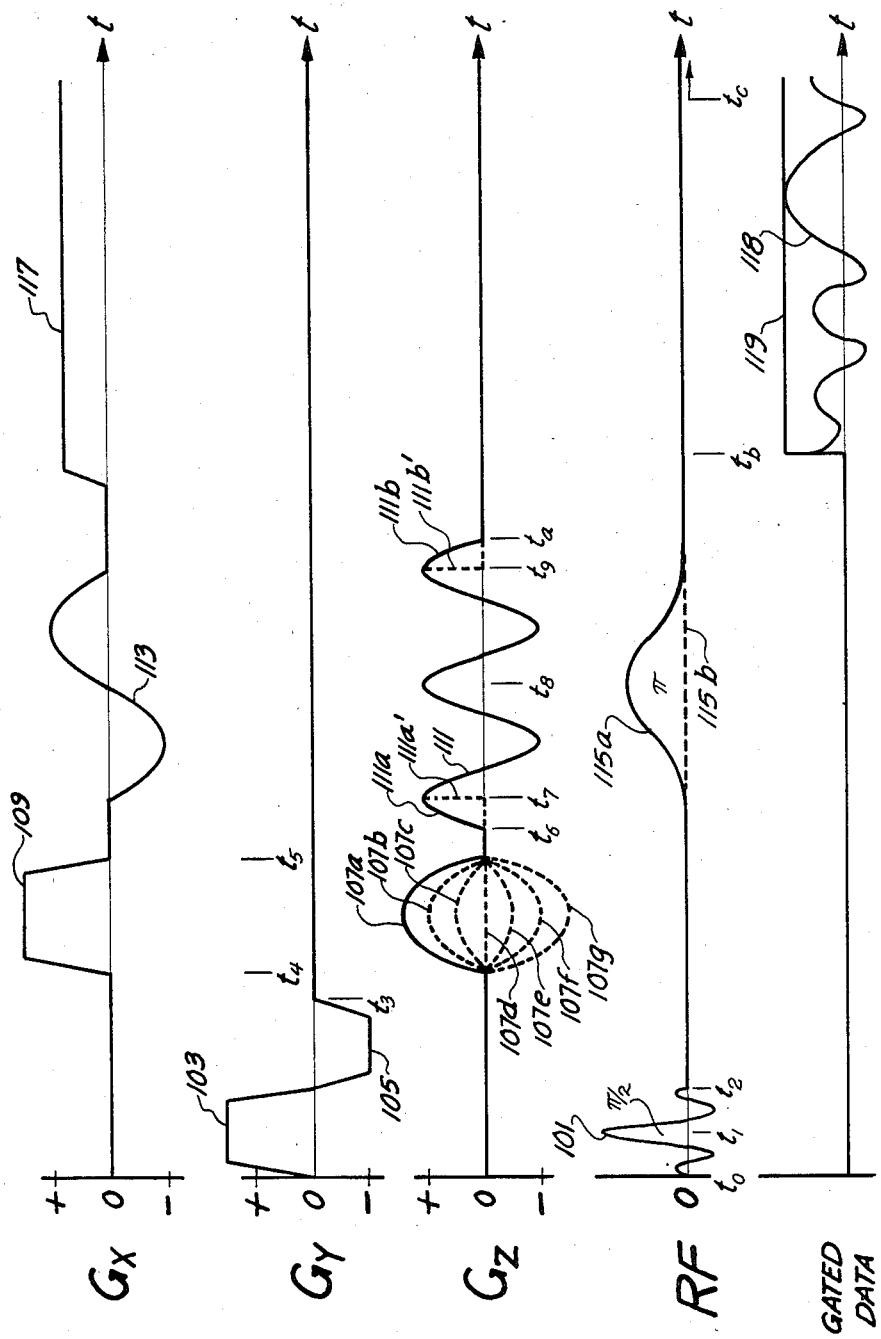

Referring now to FIG. 9, a saturation-recovery imaging sequence is illustrated utilizing the novel rotating gradient $\rho$ pulse of the present application as a spin-echo refocussing pulse. Unlike the inversion ρ pulse imaging sequence, the spin echo ρ pulse imaging sequence does not require repetition with the ρ pulse turned off, since the NMR signal which is refocused by the ρ pulse is substantially derived only from the volume of interest. Thus, the sequence commences, at time $t_0$, with a slice selection pulse, comprised of a $\pi/2$ RF signal pulse 101 (here of the sinc-envelope form), in the presence of a gradient pulse 103 in a first direction, here the gradient $G_Y$ in the Y direction; the RF signal peaks at midtime $t_1$ and substantially terminates at time $t_2$, when pulse 103 also terminates. From time $t_2$ until time $t_3$, a rephasing gradient $G_Y$ pulse 105 occurs. At time $t_4$, spatial encoding (here in the z direction) is provided by a phase-encoding gradient pulse 107, e.g. $G_z$ pulse 107a, having one of a plurality of amplitudes and a gradient pulse 109 is applied in the third, mutually-orthogonal readout direction (here the gradient $G_x$ in the x direction). These pulses terminate at time $t_5$ after which the rotating-gradient $\pi$ refocussing pulse commences at time $t_6$, with the cosinusoidal gradient "gradual" leading edge portion 111a. The ρ pulse actually commences at time $t_7$, when the sinusoidal $G_x$ gradient signal 113 commences along with the Gaussian-envelope non-zero-amplitude RF signal pulse 115a. After peaking at time $t_8$, the RF signal substantially terminates at time $t_9$, although the $G_z$ signal 111 may have a gradually-decreasing trailing edge portion 111b, which terminates at a slightly later time $t_a$. Thereafter, commencing at time $t_b$ and until a sequence termination time $t_C$, the readout gradient pulse 117 is present, while the NMR response signal 118 is received and, responsive to the open data gate 119 signal, is properly stored and processed to provide the overall image.

The only present drawback of annealed "Monad" ρ pulses is that the required magnetic field gradient slew rates may exceed the maximum slew rates available in a particular NMR system. For the two millisecond duration Monad pulse of Table I, for example, the maximum magnetic field gradient slew rate is about 30 G/cm/ms for proton ($^1$H) imaging and about 75 G/cm/ms for $^{31}$P spectroscopy. These gradient slew rates may be higher than the present capabilities of some whole-body imaging/sectroscopy NMR systems, although compatible with somewhat small scale systems (for example, a 2.0T, 15 cm. bore research system, with self shielded gradient coils, presently allows gradient slew rates of up to 100 G/cm/ms, and the Monad pulse of Table I can be utilized for both proton and phosphorous experiments therein).

It should be understood that, while FIGS. 7a, 8 and 9 are illustrated with "egg carton" ρ pulse, any other ρ pulses, such as are shown in FIGS. 3-6, described by Tables I-IV or resulting from the simulated annealing procedure or guideline criteria cited hereinabove, may similarly be utilized; the use of surface coil detection may further improve the spatial NMR response. It should also be understood that while the present examples illustrate the spatially selective volume as being set to the center of the magnet (x=0, z=0), it is possible to move the selective volume to an arbitrary preselected location (e.g., $x_c$, $z_c$) by frequency modulating the RF signal pulse. That is, if $H_1(t)$ is the original RF signal pulse waveform, $G_x(t)$ is the x-gradient signal waveform, and $G_z(t)$ is the z gradient signal waveform, then the phase $\Phi(t)$ of the modulation required to offset the selected volume to ($x_c$, $z_c$) is given by the equation $$\Phi(t) = \gamma \left[ x_c \cdot \int_{-T/2}^{t} G_x(\tau)d\tau + z_c\gamma \cdot \int_{-T/2}^{t} G_z(\tau)d\tau \right]. \quad (11)$$

If a quadrature RF transmitter is utilized, the in-phase I and quadrature-phase Q channel signals become $H_I(t)=H_1(t)\cos\phi(t)$ and $H_Q=H_1(t)\sin\Phi(t)$. For the sombrero pulse, for example, the phase becomes $$\Phi(t)=(\delta TA/2\pi)[-x_c(\cos(2\pi t/T)+1+)z_c\sin(2\pi t/T)], \quad (12)$$

with gradients of amplitude A. A plot, similar to FIG. 3b, would indeed show that the sombrero profile 28 will move such that the peak is at the given center ($x_c$, $z_c$). While equation 11 and the in-phase $H_I$ and quadrature-phase $H_Q$ equations are general and can be applied to any rotating-gradient ρ pulse, the more complicated, optimized pulses may require numerical solution, rather than direct algebraic solution. While the resulting sensitivity profile will show the expected spatial translation, the RF waveforms $H_I(t)$ and $H_Q(t)$ will not, in general, retain the symmetry of the non-spatially-translated signal waveforms. We have found that the frequency modulation raises the maximum frequencies of these RF signal quadrature waveforms, necessitating the use of additional points in the stored waveform values; typically, we have found that waveforms of about 400 points are sufficient for most NMR imaging and spectroscopy applications at the present time.

Figure 10:
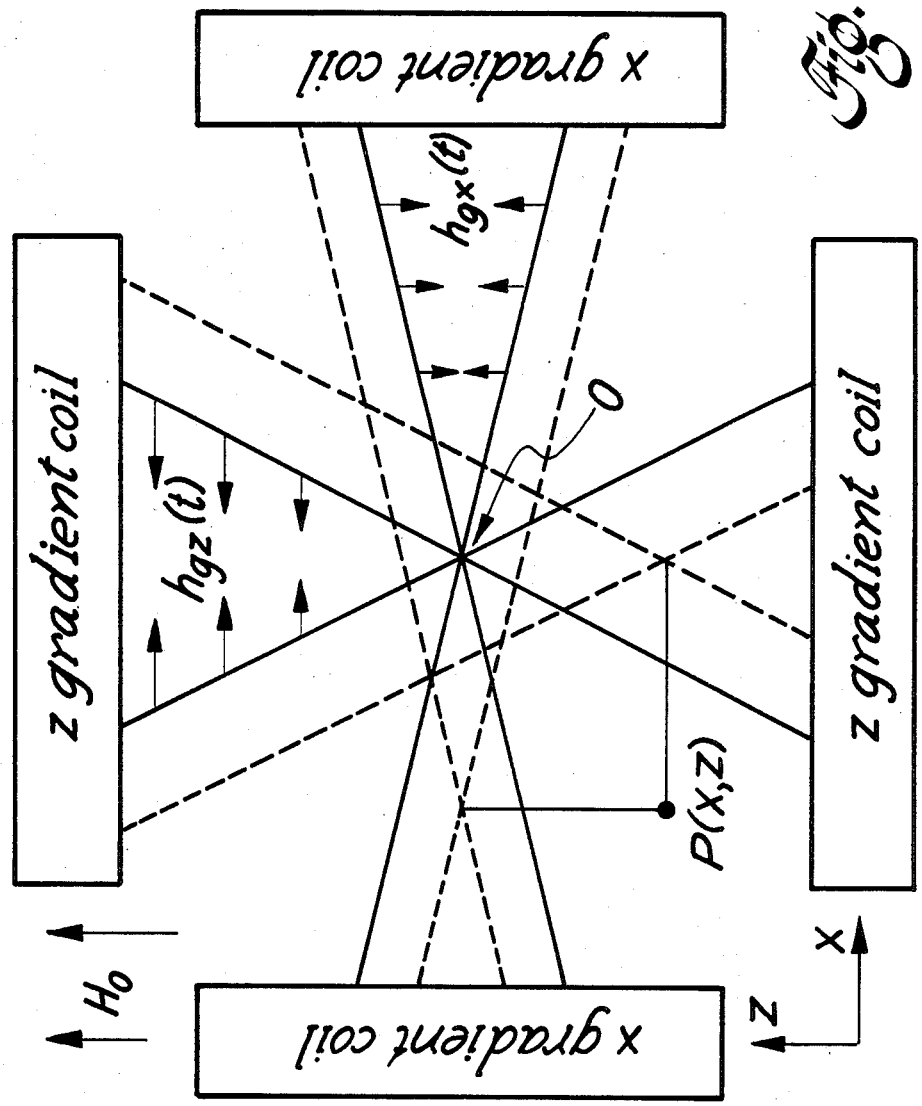
FIG. 10 is a schematic block diagram illustrating the manner by which the sensitive volume can be moved to different preselected locations within the sample volume.

Referring now to FIG. 10, an alternative method for moving the selected volume, relative to the origin, does not require RF signal frequency modulation; the new location ($x_c$, $z_c$) is provided by a linear change in the ratio of the currents in the two halves of each gradient coil. This method requires that access be available to the separate gradient coil winding halves, each of which normally carries an equal current in conventional operation, so that the sample lying in a plane at the center of each coil set experiences only the static applied field $H_o$ and the NMR excitation field, if other gradients are not applied. If the $G_x$ and $G_z$ gradients are simultaneously applied, no incremental field is experienced at only one point, i.e. at the point 0 at the intersection of the pair of gradient planes. The time-dependent gradients of the ρ pulse reorient about this point O, to define the center of the sensitive volume. Moving the selective volume to a new point P(x,z) requires that the location of each of the two zero-incremental field planes (broken lines) be moved to intersect at point P. This is accomplished by linearly varying the ratio of the currents in the two halves of each gradient coil pair, using e.g. motor-driven potentiometers incorporated in the gradient control subsystem, as described by Hinshaw (47 J. Appl. Phys. 3709 (1976)); with multiplying digital-to-analog circuitry as described by Bottomley (14 J. Phys. E. Sci. Instr. 1081 (1981)); or directly via the imaging systems computer interface and gradient amplifiers.

Figure 11:
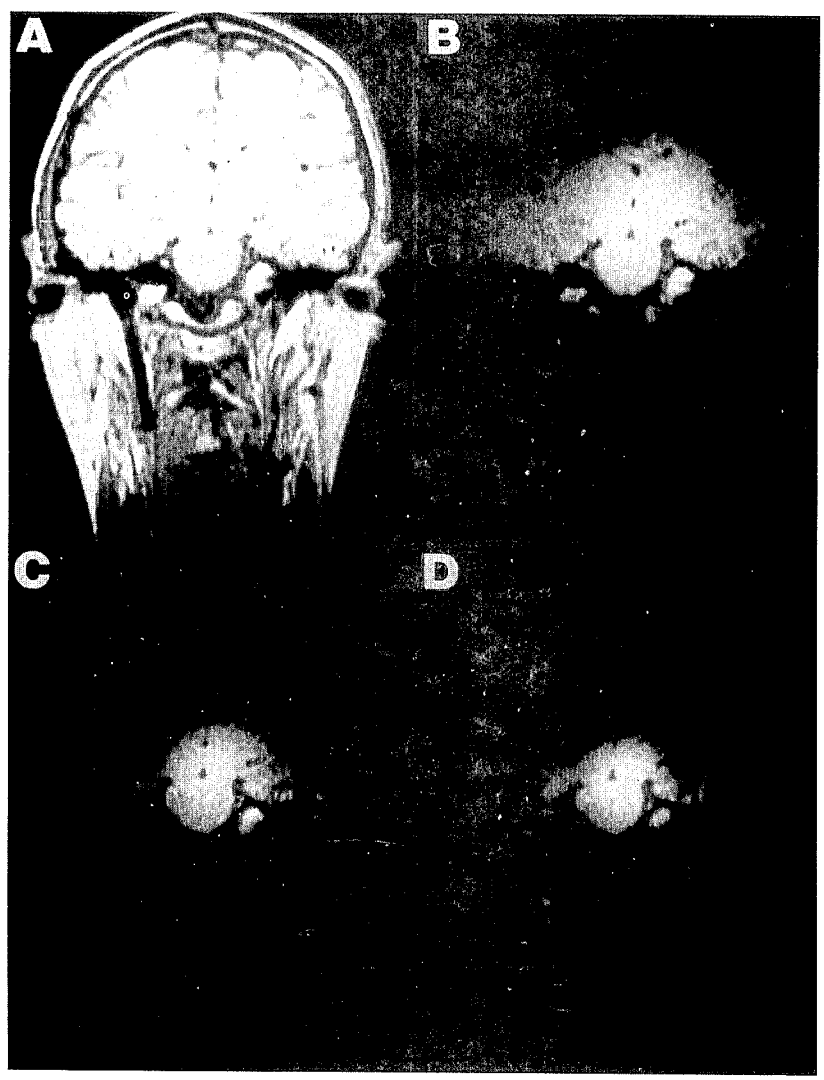
FIG. 11 is a set of images obtained by an NMR system utilizing the present invention and illustrating the results thereof.

Referring now to the NMR display images of FIG. 11, the proton ($^1$H) NMR image of the head of a normal human volunteer is shown in the coronal view of the A portion. This image (in which the x axis is horizontal at about the level of the ears, and the z axis is vertical approximately on the midline) was acquired with the imaging sequence of FIG. 8, with the two-dimensional localizing gradients turned off by reduction of the RF signal portion 86b amplitude to essential zero. The B, C and D image portions, with gradually decreasing fields of view, are provided by use of an egg-carton ρ pulse having a T=2 millisecond duration and employing respective x-axis modulating gradient amplitudes of 0.05, 0.075 and 0.1 G/cm., respectively. The resulting FWHM diameter of the bright central region is about 10 centimeters in portion B and about 5 centimeters in portion D. It will be seen that two-dimensional localizing pulses are in fact provided by our inventive rotating-gradient pulses.

While several presently preferred embodiments of our rotating-gradient special localization pulses are presented herein by way of explanation and illustration, many variations and modifications will now occur to those skilled in the art. It is our intent, therefore, to be limited only by the scope of the appending claims and not by the specific details and instrumentalities presented by way of explanation herein.

What is claimed is:

1. A NMR rotating-gradient ρ pulse for providing two-dimensional spatially-selective NMR excitation of a portion of a sample immersed in a static magnetic field, comprises:
   a single pulse of an RF signal applying a $H_1$ magnetic field to the sample with a selected envelope amplitude characteristic for nutating spins in said sample portion through substantially 180° in a pulse time interval T; and
   a net magnetic field gradient, applied to the sample in the presence of the magnetic field of the RF signal pulse, having a direction varying in a pair of spatial dimensions in which selection is to occur during said interval T.

2. The ρ pulse of claim 1, wherein the RF signal envelope is substantially symmetrical about a temporal midpoint of the pulse time interval T.

3. The ρ pulse of claim 2, wherein the net magnetic field gradient is composed of a first magnetic field gradient in a first direction and having a first amplitude function; and a second magnetic field gradient in a second direction, orthogonal to said first direction, and having a second amplitude function.

4. The ρ pulse of claim 3, wherein the first amplitude function is anti-symmetrical about said pulse temporal midpoint and the second amplitude function is symmetrical about said pulse temporal midpoint.

5. The ρ pulse of claim 4, wherein: the first magnetic field gradient amplitude is a sinusoidal function; and the second magnetic field gradient is a cosinusoidal function.

6. The ρ pulse of claim 5, wherein only one cycle of the first gradient function occurs in pulse time interval T.

7. The ρ pulse of claim 6, wherein only one cycle of the second gradient function occurs in pulse time interval T.

8. The ρ pulse of claim 7, wherein the RF magnetic field envelope is a substantially rectangular pulse.

9. The ρ pulse of claim 5, wherein two full cycles of the second gradient function occurs in pulse time interval T.

10. The ρ pulse of claim 9, wherein the RF signal envelope has a Gaussian function.

11. The ρ pulse of claim 10, herein the FWHM duration of the envelope is about one-half of the total pulse time interval T.

12. The ρ pulse of claim 10, wherein the FWHM duration of the envelope is about one-third of the total pulse time interval T.

13. The ρ pulse of claim 10, wherein the peak amplitude of the first gradient function envelope is different from the peak amplitude of the second function gradient envelope.

14. The ρ pulse of claim 4, wherein the RF signal envelope and the first and second gradient amplitude functions are functions obtained by simulated annealing of the total excited spatial response from the sample.

15. The ρ pulse of claim 1, wherein the RF signal pulse is frequency modulated to move the spatially-selectively excited portion to a preselected location at least within the volume of the sample.

16. A method for obtaining spatial localization in at least two dimensions in an NMR imaging/spectroscopy procedure using a selected sequence having at least one signal for NMR excitation substantially by 180° to produce NMR spin inversion and obtaining NMR response data from at least a portion of a sample immersed in a static magnetic field, comprising the steps of:
   obtaining NMR response data from a predetermined number of pairs of the selected sequence;
   utilizing, for at least one of the 180° signals in a selected first or second one of each pair of sequences, a rotating-gradient ρ pulse comprising a single pulse of an RF signal with a selected non-zero envelope amplitude characteristic for applying a magnetic field to the sample to nutate NMR spins in said sample portion through substantially 180° in a pulse time interval T; and a net magnetic field gradient, applied to the sample in the presence of the magnetic field of the RF signal pulse, having a direction varying in a pair of spatial dimensions in which selection is to occur;
   utilizing, for the same at least one 180° signals but in the remaining one of each pair of sequences, a ρ pulse with a substantially zero envelope amplitude characteristic; and
   obtaining final response data from the difference of the response data obtained in the first and second sequences of each sequence pair.

17. The method of claim 16, further comprising the step of frequency modulating the RF signal of the ρ pulse to move the location of the sample portion selected by that ρ pulse, from which the response data is obtained, to a preselected location at least within the volume of the sample.

18. The method of claim 16, wherein the net magnetic field gradient is provided responsive to currents in at least one set of gradient coils; and further comprising the step of varying the ratio of currents in the at least one set of gradient coils during the ρ pulse, to move the location of the sample portion selected by the ρ pulse from which the response data is obtained, to a preselected location at least within the volume of the sample.

19. The method of claim 16, including the step of detecting the response data with a surface detection coil.

20. The method of claim 19, including the step of positioning the sample volume to be selectively excited substantially on the axis of the surface coil.

21. The method of claim 16, wherein the characteristic of the rotating net magnetic field gradient is varied to vary the size of the sample portion from which the response data is obtained.

22. A method for obtaining spatial localization of NMR responses in at least two dimensions in an NMR imaging/spectroscopy procedure using a selected sequence having at least one signal for NMR spin refocussing with a substantially 180° NMR excitation signal comprising the step of utilizing for the 180° spin refocussing signal a rotating-gradient $\rho$ pulse comprising: a single pulse of an RF signal with a selected non-zero envelope amplitude characteristic for applying a magnetic field to the sample to nutate NMR spins in said sample portion through substantially 180° in a pulse time interval T; and a net magnetic field gradient, applied to the sample in the presence of the magnetic field of the RF signal pulse, having a direction varying in a pair of spatial dimensions in which selection is to occur.

23. The method of claim 22, wherein the net magnetic field gradient is provided responsive to currents in at least one set of gradient coils; and further comprising the step of varying the ratio of currents in the at least one set of gradient coils during the $\rho$ pulse, to move the location of the sample portion selected by the $\rho$ pulse from which the response data is obtained, to a preselected location at least within the volume of the sample.

24. The method of claim 22, including the step of detecting the response data with a surface detection coil.

25. The method of claim 24, including the step of positioning the sample volume to be selectively excited substantially on the axis of the surface coil.

* * * * *